(12) United States Patent
Park et al.

(10) Patent No.: US 12,389,584 B2
(45) Date of Patent: Aug. 12, 2025

(54) SEMICONDUCTOR MEMORY DEVICES AND METHODS FOR MANUFACTURING THE SAME

(71) Applicant: Samsung Electronics Co., Ltd., Suwon-si (KR)

(72) Inventors: Sung Il Park, Suwon-si (KR); Jae Hyun Park, Hwaseong-si (KR); Min Gyu Kim, Hwaseong-si (KR); Do Young Choi, Hwaseong-si (KR); Dae Won Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 593 days.

(21) Appl. No.: 17/577,120

(22) Filed: Jan. 17, 2022

(65) Prior Publication Data

US 2022/0415906 A1 Dec. 29, 2022

(30) Foreign Application Priority Data

Jun. 24, 2021 (KR) ........................ 10-2021-0082023

(51) Int. Cl.
*H10B 10/00* (2023.01)
*H10D 30/01* (2025.01)
(Continued)

(52) U.S. Cl.
CPC ......... *H10B 10/125* (2023.02); *H10D 30/031* (2025.01); *H10D 30/6713* (2025.01);
(Continued)

(58) Field of Classification Search
CPC .............. H10B 10/125; H01L 29/0665; H01L 29/42392; H01L 29/66545; H01L 29/66553; H01L 29/66742
(Continued)

(56) References Cited

U.S. PATENT DOCUMENTS 9,812,574 B2 11/2017 Pillarisetty et al.
10,304,833 B1 5/2019 Suvarna et al.
(Continued)

FOREIGN PATENT DOCUMENTS

KR 20100126188 A 12/2010
KR 20200055887 A 5/2020

*Primary Examiner* — Ori Nadav
(74) *Attorney, Agent, or Firm* — Myers Bigel, P.A.

(57) ABSTRACT

A semiconductor memory device and a method for manufacturing the same. The semiconductor memory device may include a substrate, a first lower wire pattern and a first upper wire pattern stacked on the substrate, and spaced apart from each other; a second lower wire pattern and a second upper wire pattern stacked on the substrate, spaced apart from each other, and spaced apart from the first lower and upper wire patterns; a first gate line surrounding the first lower wire pattern and the first upper wire pattern; a second gate line surrounding the second lower wire pattern and the second upper wire pattern and spaced apart from the first gate line; a first lower source/drain area; a first upper source/drain area; and a first overlapping contact that electrically connects the first lower source/drain area, the first upper source/drain area and the second gate line to each other.

19 Claims, 27 Drawing Sheets

(51) Int. Cl.
  *H10D 30/67* (2025.01)
  *H10D 62/10* (2025.01)
  *H10D 64/01* (2025.01)

(52) U.S. Cl.
  CPC ..... *H10D 30/6735* (2025.01); *H10D 30/6757* (2025.01); *H10D 62/118* (2025.01); *H10D 64/017* (2025.01); *H10D 64/018* (2025.01)

(58) Field of Classification Search
  USPC .......................................................... 257/293
  See application file for complete search history.

(56) References Cited

U.S. PATENT DOCUMENTS

| | | |
|---|---|---|
| 10,381,438 B2 | 8/2019 | Zhang et al. |
| 10,707,218 B2 | 7/2020 | Paul et al. |
| 10,756,096 B2 | 8/2020 | Paul et al. |
| 11,063,045 B2* | 7/2021 | Wu .................... H01L 23/5286 |
| 12,068,323 B2* | 8/2024 | Bae ...................... H01L 29/775 |
| 2020/0381426 A1 | 12/2020 | Xu et al. |
| 2021/0098294 A1 | 4/2021 | Smith et al. |
| 2021/0098473 A1 | 4/2021 | Lin et al. |
| 2024/0162289 A1* | 5/2024 | Ma .................... H01L 29/42392 |
| 2024/0249946 A1* | 7/2024 | Wallace ................ H01L 21/308 |

\* cited by examiner

SEMICONDUCTOR MEMORY DEVICES AND METHODS FOR MANUFACTURING THE SAME

CROSS-REFERENCE TO RELATED APPLICATION

This application claims priority from Korean Patent Application No. 10-2021-0082023 filed on Jun. 24, 2021, in the Korean Intellectual Property Office, and all the benefits accruing therefrom under 35 U.S.C. § 119, and the entire contents of the above-identified application are herein incorporated by reference.

TECHNICAL FIELD

Aspects of the present disclosure relate to semiconductor memory devices and methods for manufacturing the same.

BACKGROUND

One way semiconductor memory devices may be classified is into volatile memory devices and non-volatile memory devices. A volatile memory device is a memory device in which stored data therein is removed or lost when power supply to the memory device is removed or turned off, and examples may include SRAM (Static RAM), DRAM (Dynamic RAM), and SDRAM (Synchronous DRAM). A non-volatile memory device is a memory device that retains stored data therein even when power supply to the memory device is lost or removed, and examples may include ROM (Read Only Memory), PROM (Programmable ROM), EPROM (Electrically Programmable ROM), EEPROM (Electrically Erasable and Programmable ROM), flash memory devices, resistance memory devices such as PRAM (Phase-change RAM), FRAM (Ferroelectric RAM), RRAM (Resistive RAM), and the like.

While DRAM uses a capacitor to store data therein, SRAM may store data therein using a latch. SRAM has lower integration density compared to DRAM, but has advantages in that a peripheral circuit thereof is simple, SRAM operates at high speed with low power, and does not need to periodically refresh stored information.

As integration levels of semiconductor memory devices are increasing, individual circuit patterns are becoming more miniaturized in order to implement a larger number of semiconductor memory devices in the same area. To this end, semiconductor memory devices that use multi-gate transistors are being studied.

SUMMARY

Some aspects of the present disclosure provide semiconductor memory devices with improved integration density and reduced process difficulty.

Some aspects of the present disclosure provide methods for manufacturing semiconductor memory devices with improved integration density and reduced process difficulty.

The present disclosure is not limited to the aspects provided above or to those explicitly stated herein. Other aspects and purposes of the present disclosure that are not mentioned herein may be understood based on following descriptions, and may be more clearly understood based on examples of embodiments of the inventive concepts provided by the present disclosure. Further, it will be easily understood that some aspects, purposes, and advantages according to the present disclosure may be realized using means shown in the claims and combinations thereof.

According to some aspects of the present inventive concepts, there is provided a semiconductor memory device comprising a substrate, a first lower wire pattern and a first upper wire pattern sequentially stacked on the substrate, and spaced apart from each other, each extending in a first direction, a second lower wire pattern and a second upper wire pattern sequentially stacked on the substrate, and spaced apart from each other, each extending in the first direction, the second lower wire pattern and the second upper wire pattern spaced apart from the first lower wire pattern and the first upper wire pattern in a second direction that intersects the first direction, a first gate line extending in the second direction, and surrounding the first lower wire pattern and the first upper wire pattern, a second gate line extending in the second direction, and surrounding the second lower wire pattern and the second upper wire pattern, the second gate line spaced apart from the first gate line in the second direction, a first lower source/drain area having a first conductivity type, on one side surface of the first gate line, and connected to the first lower wire pattern, a first upper source/drain area having a second conductivity type different from the first conductivity type, on one side surface of the first gate line, and connected to the first upper wire pattern, and a first overlapping contact that electrically connects the first lower source/drain area, the first upper source/drain area and the second gate line to each other, wherein the first overlapping contact at least partially vertically overlaps the first gate line, wherein the first gate line includes a first gate electrode and a recess capping pattern, wherein the recess capping pattern covers a top surface of the first gate electrode that overlaps the first overlapping contact, wherein the second gate line includes a second gate electrode and a gate capping pattern, wherein the gate capping pattern covers a top surface of the second gate electrode, and wherein a vertical level of a bottom surface of the recess capping pattern is lower than a vertical level of a bottom surface of the gate capping pattern.

According to some aspects of the present inventive concepts, there is provided a semiconductor memory device comprising a substrate, a first lower wire pattern and a first upper wire pattern sequentially stacked on the substrate, and spaced apart from each other, each extending in a first direction, a second lower wire pattern and a second upper wire pattern sequentially stacked on the substrate, and spaced apart from each other, each extending in the first direction, the second lower wire pattern and the second upper wire pattern spaced apart from the first lower wire pattern and the first upper wire pattern in a second direction that intersects the first direction, a first gate line extending in the second direction, and surrounding the first lower wire pattern and the first upper wire pattern, a second gate line extending in the second direction, and surrounding the second lower wire pattern and the second upper wire pattern, wherein the second gate line is spaced apart from the first gate line in the second direction, a first lower source/drain area having a first conductivity type, on one side of the first gate line, and connected to the first lower wire pattern, a first upper source/drain area having a second conductivity type different from the first conductivity type, on one side of the first gate line, and connected to the first upper wire pattern, and a common contact extending in a third direction that intersects a top surface of the substrate, wherein the common contact is connected to the first lower source/drain area and the first upper source/drain area, and an overlapping contact that electrically connects the common contact and the second gate line to each other, the overlapping contact at least partially overlapping the first gate line.

According to some aspects of the present inventive concepts, there is provided a semiconductor memory device comprising a substrate, a first lower wire pattern and a first upper wire pattern sequentially stacked on the substrate, and spaced apart from each other, each extending in a first direction, a second lower wire pattern and a second upper wire pattern sequentially stacked on the substrate, and spaced apart from each other, each extending in the first direction, the second lower wire pattern and the second upper wire pattern spaced apart from the first lower wire pattern and the first upper wire pattern in a second direction that intersects the first direction, a first gate line extending in the second direction, and surrounding the first lower wire pattern and the first upper wire pattern, a second gate line extending in the second direction, and surrounding the second lower wire pattern and the second upper wire pattern, wherein the second gate line is spaced apart from the first gate line in the second direction, a third gate line extending in the second direction, and surrounding the first lower wire pattern and the first upper wire pattern, and spaced apart from the first gate line in the first direction, a fourth gate line extending in the second direction, and surrounding the second lower wire pattern and the second upper wire pattern, and spaced apart from the third gate line in the second direction, a first lower source/drain area having a first conductivity type, between the first gate line and the third gate line, and connected to the first lower wire pattern, a first upper source/drain area having a second conductivity type different from the first conductivity type, between the first gate line and the third gate line, and connected to the first upper wire pattern, and a first overlapping contact that electrically connects the first lower source/drain area, the first upper source/drain area, and the second gate line to each other, wherein the first overlapping contact at least partially overlaps the first gate line, wherein each of the first to fourth gate lines includes a gate electrode and a gate capping pattern that covers a top surface of the gate electrode, wherein the first gate line further includes a first recess capping pattern that covers a top surface of the gate electrode of the first gate line overlapping the first overlapping contact, and wherein a vertical level of a bottom surface of the first recess capping pattern is lower than a vertical level of a bottom surface of the gate capping pattern.

BRIEF DESCRIPTION OF DRAWINGS

The above and other aspects and features of the present disclosure will become more apparent by describing in detail some examples of embodiments thereof with reference to the attached drawings, in which.

DETAILED DESCRIPTIONS

It will be understood that, although the terms "first", "second", "third", and so on may be used herein for illustrating various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Hereinafter, a semiconductor memory device according to some embodiments will be described with reference to FIGS. 1 to 12.

Figure 1:
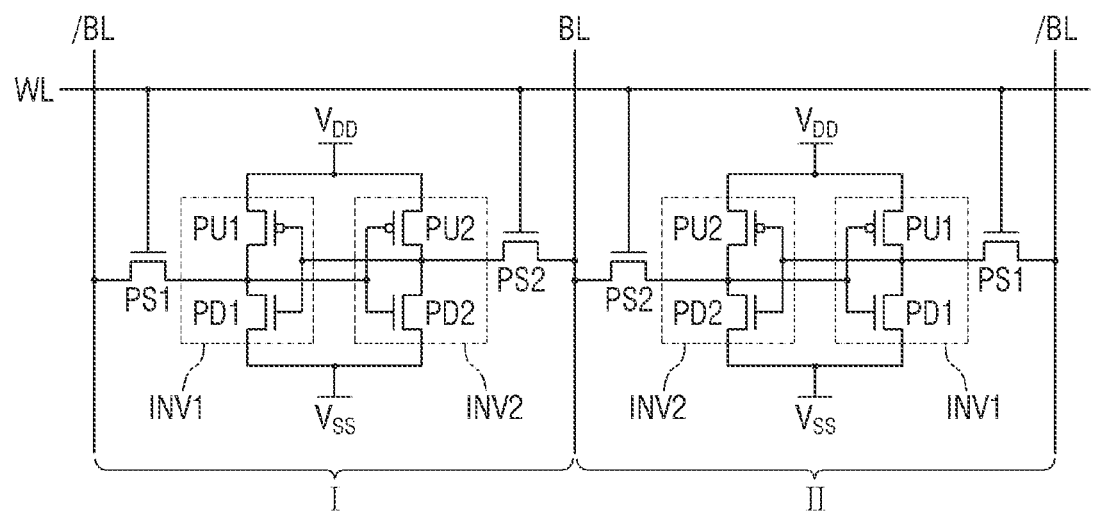
FIG. 1 is a circuit diagram for illustrating a semiconductor memory device according to some embodiments.
Figure 2:
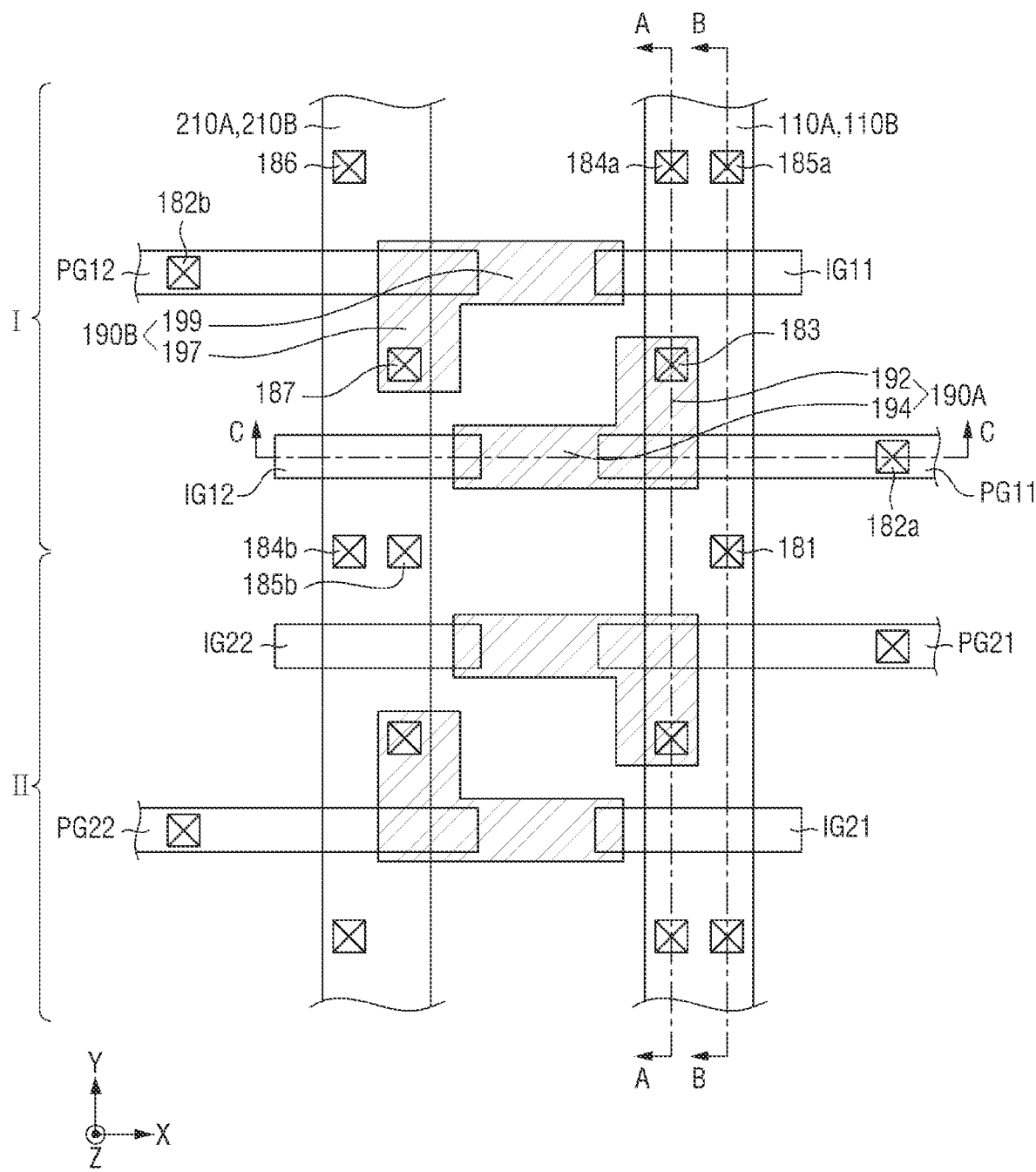
FIG. 2 is an exemplary layout diagram for illustrating the semiconductor memory device of FIG. 1.
Figure 3:
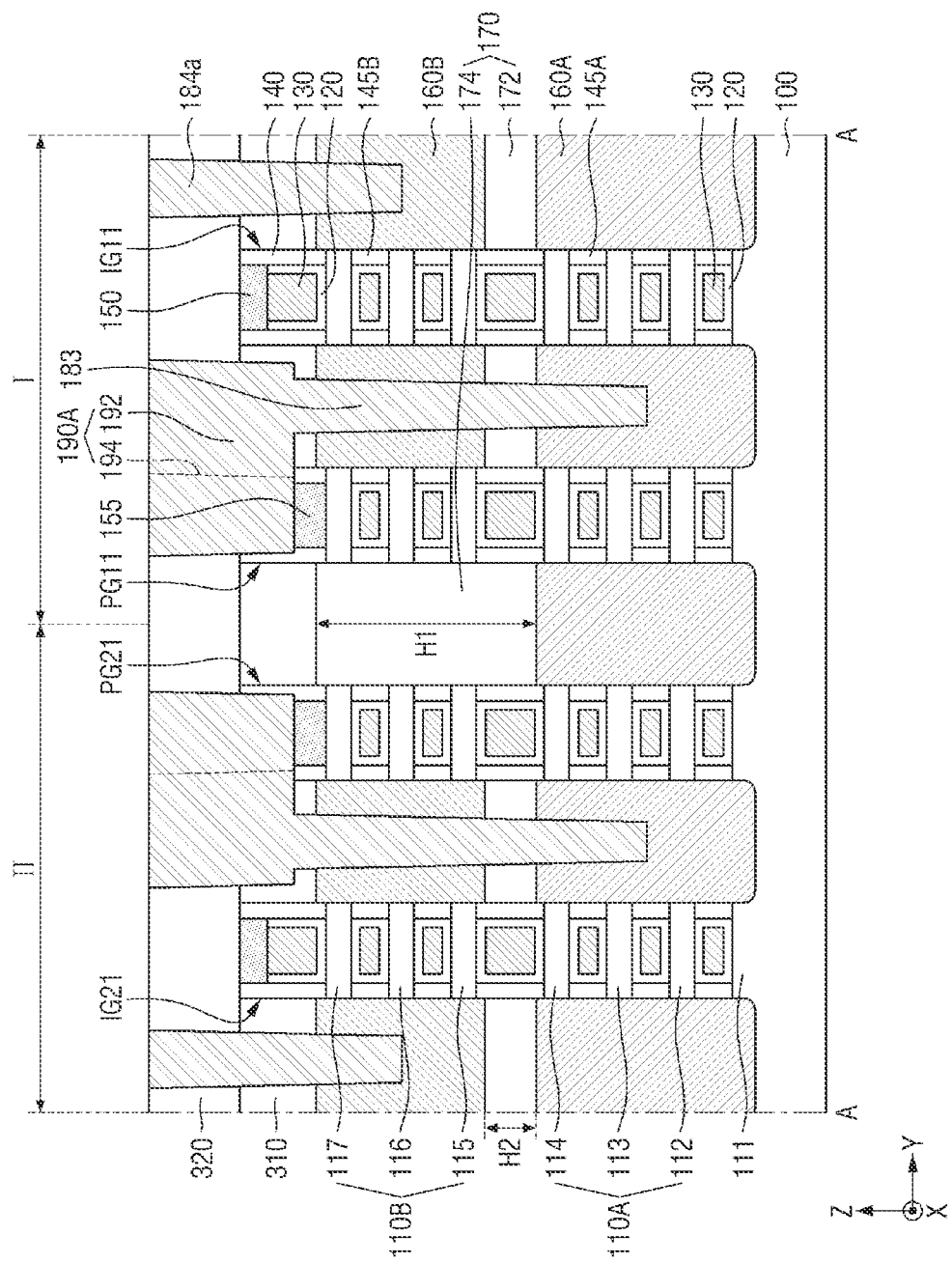
FIG. 3 is a cross-sectional view taken along a line A-A of FIG. 2.
Figure 4:
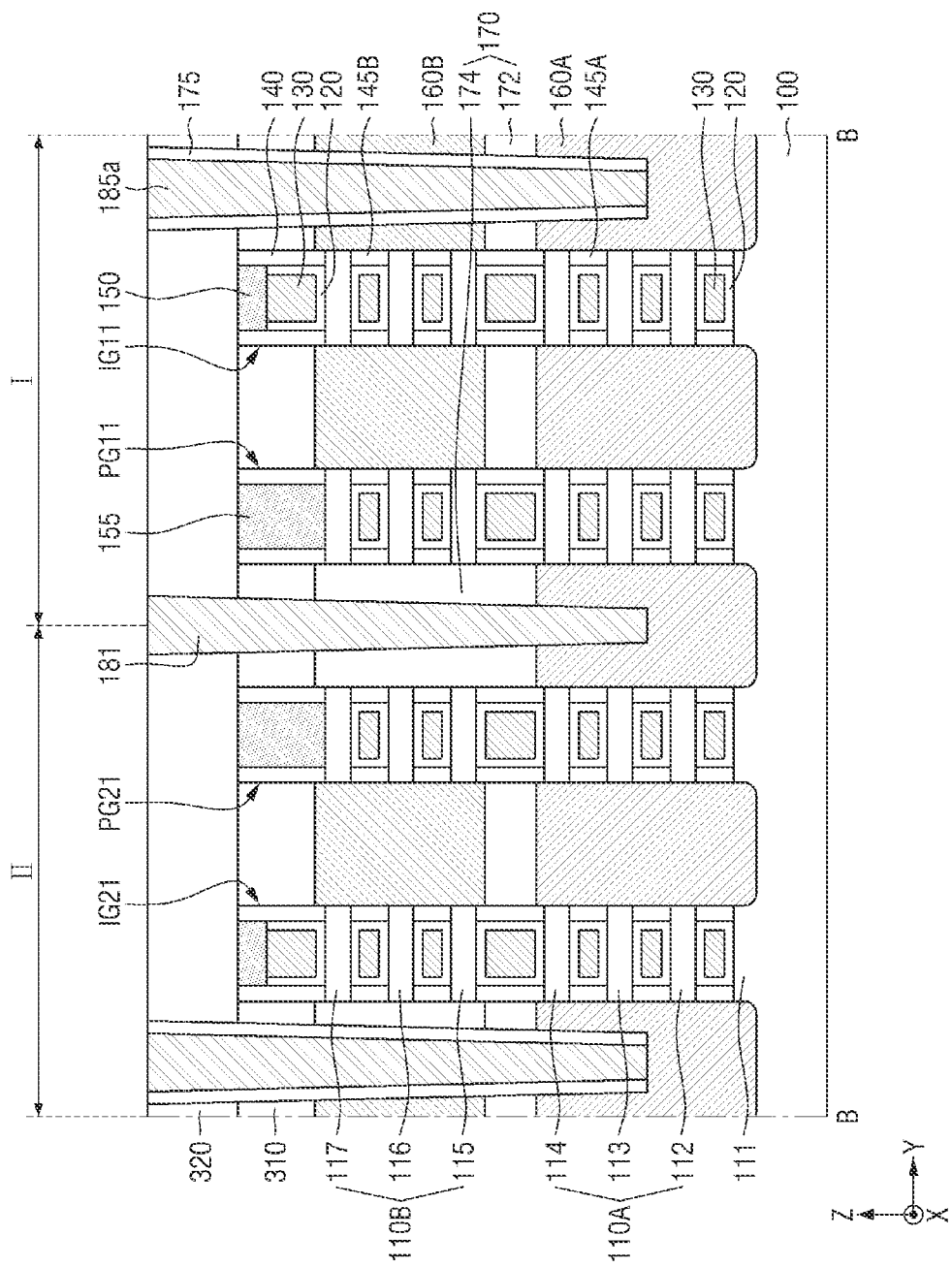
FIG. 4 is a cross-sectional view taken along a line B-B in FIG. 2.
Figure 5:
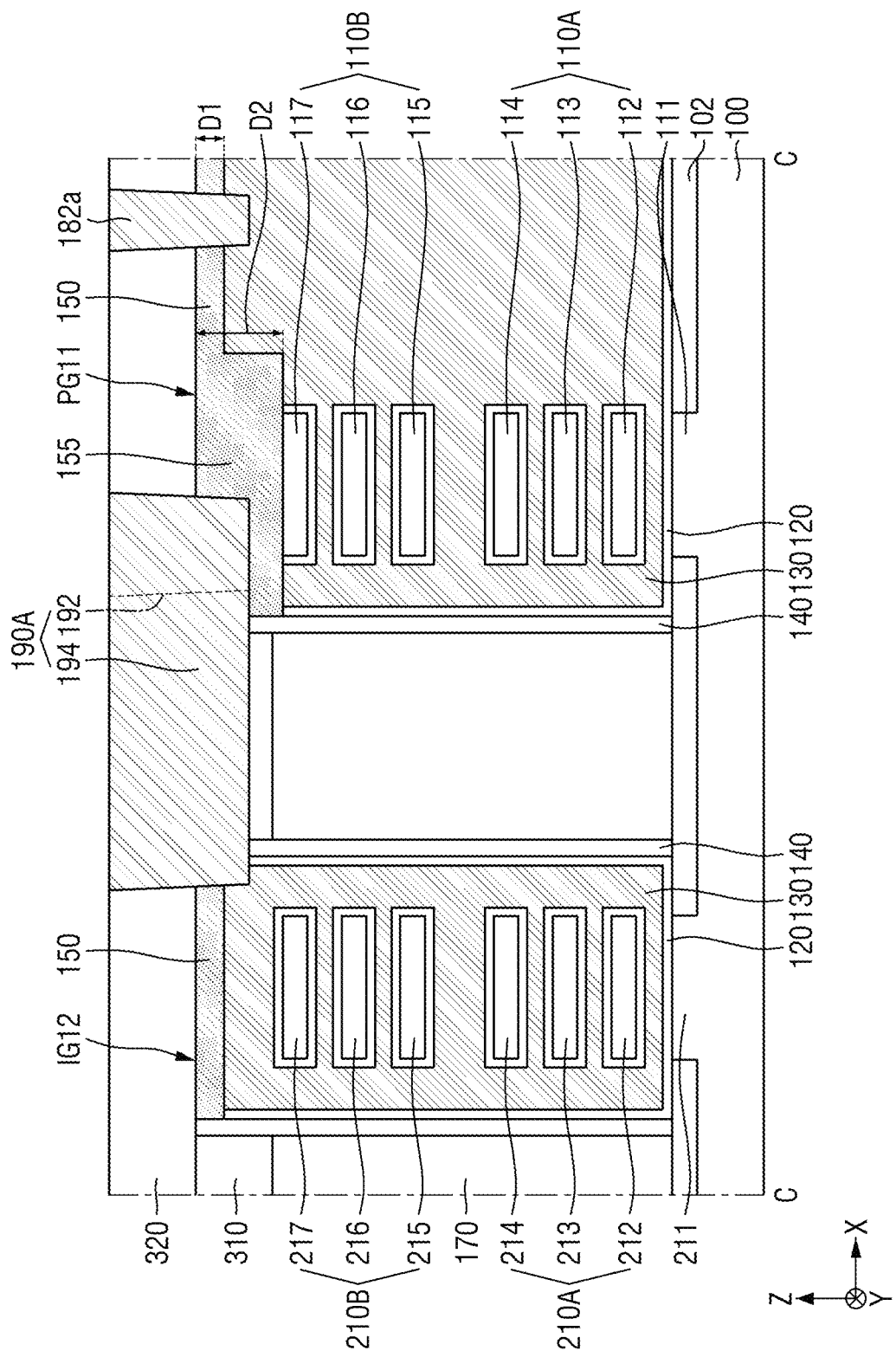
FIG. 5 is a cross-sectional view taken along a line C-C in FIG. 2.

FIG. 1 is a circuit diagram for illustrating a semiconductor memory device according to some embodiments. FIG. 2 is an exemplary layout diagram for illustrating the semiconductor memory device of FIG. 1. FIG. 3 is a cross-sectional view taken along a line A-A of FIG. 2. FIG. 4 is a cross-sectional view taken along a line B-B in FIG. 2. FIG. 5 is a cross-sectional view taken along a line C-C in FIG. 2.

Referring to FIG. 1, the semiconductor memory device according to some embodiments includes a first unit element I and a second unit element II adjacent to each other.

Each of the first unit element I and the second unit element II may include a pair of inverters INV1 and INV2 connected in parallel with each other and connected to and between a power node $V_{DD}$ and a ground node $V_{SS}$. Each of the first unit element I and the second unit element II may also include a first pass transistor PS1 and a second pass transistor PS2 respectively connected to output nodes of the inverters INV1 and INV2.

The first pass transistor PS1 may be connected to a bit-line BL, and the second pass transistor PS2 may be connected to a complementary bit-line /BL. A gate of each of the first pass transistor PS1 and the second pass transistor PS2 may be connected to a word-line WL.

To configure one latch circuit, an input node of the first inverter INV1 may be connected to an output node of the second inverter INV2, while an input node of the second inverter INV2 is connected to an output node of the first inverter INV1.

The first inverter INV1 may include a first pull-up transistor PU1 and a first pull-down transistor PD1 connected in series with each other. The second inverter INV2 may include a second pull-up transistor PU2 and a second pull-down transistor PD2 connected in series with each other. Each of the first pull-up transistor PU1 and the second pull-up transistor PU2 may be embodied as a P-type field effect transistor (PFET), and each of the first pull-down transistor PD1 and the second pull-down transistor PD2 may be embodied as N-type field effect transistor (NFET).

In some embodiments, the first unit element I and the second unit element II may share one bit-line BL. For example, two complementary bit-lines /BL may extend in parallel to each other and may be around one bit-line BL. In this connection, the first unit element I may be defined between one complementary bit-line /BL of the two complementary bit-lines /BL and the bit-line BL. The second unit element II may be defined between the other complementary bit-line /BL of the two complementary bit-lines /BL and the bit-line BL.

Referring to FIG. 2 to FIG. 5, the semiconductor memory device according to some embodiments may include a substrate 100, wire patterns 110A, 110B, 210A, and 210B, a field insulating film 102, first to fourth gate lines PG11, IG11, IG12, and PG12, fifth to eighth gate lines PG21, IG21, IG22, and PG22, source/drain areas 160A and 160B, a separating insulating film 170, interlayer insulating films 310 and 320, a first overlapping contact 190A and a second overlapping contact 190B.

The wire patterns 110A, 110B, 210A and 210B and the first to fourth gate lines PG11, IG11, IG12, and PG12 may constitute the first unit element I. The wire patterns 110A, 110B, 210A and 210B and the fifth to eighth gate lines PG21, IG21, IG22, and PG22 may constitute the second unit element II. Hereinafter, the semiconductor memory device according to some embodiments will be described based on the first unit element I. However, those of ordinary skill in the art to which the present disclosure pertains will understand that the description of the first unit element I may be equally applied to the second unit element II. For example, the fifth to eighth gate lines PG21, IG21, IG22, and PG22 may correspond to the first to fourth gate lines PG11, IG11, IG12, and PG12, respectively. In some embodiments, the first unit element I and the second unit element II may be symmetrically arranged with each other around a boundary between the first unit element I and the second unit element II in a plan view.

The substrate 100 may be made of bulk silicon or SOI (silicon-on-insulator). Alternatively, the substrate 100 may be embodied as a silicon substrate, or may be made of a material other than silicon, such as silicon germanium, SGOI (silicon germanium on insulator), indium antimonide, lead telluride, indium arsenide, indium phosphide, gallium arsenide or gallium antimonide, with the understanding that the present disclosure is not limited to these examples. Alternatively, the substrate 100 may include a base substrate and an epitaxial layer formed on the base substrate. For convenience of description, an example in which the substrate 100 is embodied as the silicon substrate is described below.

A first lower wire pattern 110A and a first upper wire pattern 110B may be sequentially stacked on the substrate 100. The first lower wire pattern 110A may be spaced apart from the substrate 100 and may be above the substrate 100, and the first upper wire pattern 110B may be spaced apart from the first lower wire pattern 110A and may be above the first lower wire pattern 110A. Each of the first lower wire pattern 110A and the first upper wire pattern 110B may extend in a first direction (e.g., a Y direction) parallel to a top surface of the substrate 100.

In some embodiments, the first lower wire pattern 110A may include a plurality of nanosheets (e.g., first to third nanosheets 112, 113, and 114) sequentially stacked on the substrate 100 and spaced apart from each other. In some embodiments, the first upper wire pattern 110B may include a plurality of nanosheets (e.g., fourth to sixth nanosheets 115, 116, and 117) that are sequentially stacked on the first lower wire pattern 110A and spaced apart from each other.

In some embodiments, a first pin-like pattern 111 may be formed between the substrate 100 and the first lower wire pattern 110A. The first pin-like pattern 111 may protrude from the top surface of the substrate 100 and extend in the first direction (e.g., the Y direction). The first pin-like pattern 111 may be formed by etching a portion of the substrate 100, or may be embodied as an epitaxial layer grown from the substrate 100.

The second lower wire pattern 210A and the second upper wire pattern 210B may be sequentially stacked on the substrate 100. The second lower wire pattern 210A may be spaced apart from the substrate 100 and may be above the substrate 100, and the second upper wire pattern 210B may be spaced apart from the second lower wire pattern 210A and may be above the second lower wire pattern 210A. Each of the second lower wire pattern 210A and the second upper wire pattern 210B may extend in the first direction (e.g., the Y direction). The second lower wire pattern 210A and the second upper wire pattern 210B may be spaced apart from the first lower wire pattern 110A and the first upper wire pattern 110B in a second direction (e.g., the X direction) that is parallel to the top surface of the substrate 100 and that intersects the first direction.

In some embodiments, the second lower wire pattern 210A may be at the same level as that of the first lower wire pattern 110A, and the second upper wire pattern 210B may be at the same level as that of the first upper wire pattern 110B. As used herein, layers that are "at the same layer" as each other (e.g., "a first layer is at the same level as a second layer") means that a vertical dimension between the first layer and the top surface of the substrate 100 is equal to a vertical dimension between the second layer and the top surface of the substrate 100. Further, as used herein, the terms "the same" and "equal" are intended to encompass not only completely the same, but also substantially the same which includes an insignificant difference that may occur due to a margin on a process.

In some embodiments, the second lower wire pattern 210A may include a plurality of nanosheets (e.g., seventh to ninth nanosheets 212, 213, and 214) that are sequentially stacked on the substrate 100 and spaced apart from each other. In some embodiments, the second upper wire pattern 210B may include a plurality of nanosheets (e.g., tenth to twelfth nanosheets 215, 216, and 217) that are sequentially stacked on the second lower wire pattern 210A and spaced apart from each other.

In some embodiments, a second pin-like pattern 211 may be formed between the substrate 100 and the second lower wire pattern 210A. The second pin-like pattern 211 may protrude from the top surface of the substrate 100 and extend in the first direction (e.g., the Y direction). The second pin-like pattern 211 may be formed by etching a portion of the substrate 100, or may be embodied as an epitaxial layer grown from the substrate 100.

Each of the wire patterns 110A, 110B, 210A and 210B may include an elemental semiconductor material such as silicon (Si) or germanium (Ge). Alternatively, each of the wire patterns 110A, 110B, 210A, and 210B may include a compound semiconductor, for example, a group IV-IV compound semiconductor or a group III-V compound semiconductor. The group IV-IV compound semiconductor may include, and as non-limiting examples, a binary compound including two of carbon (C), silicon (Si), germanium (Ge), and tin (Sn), a ternary compound including three thereof, or a compound obtained by doping a group IV element thereto. The group III-V compound semiconductor may include, and as non-limiting examples, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

As best seen in FIG. 5, the field insulating film 102 may be formed on the substrate 100. In some embodiments, the field insulating film 102 may cover at least a portion of a side surface of the first pin-like pattern 111 and at least a portion of a side surface of the second pin-like pattern 211. The field insulating film 102 may include, for example, at least one of an oxide film, a nitride film, an oxynitride film, and a combination thereof, with the understanding that the present disclosure is not limited thereto.

The first gate line PG11 may extend in the second direction (e.g., the X direction) and may intersect the first lower wire pattern 110A and the first upper wire pattern 110B. The second gate line IG11 may be spaced apart from the first gate line PG11 in the first direction (e.g., the Y direction). The second gate line IG11 may extend in the second direction (e.g., the X direction) and may intersect the first lower wire pattern 110A and the first upper wire pattern 110B.

Each of the first gate line PG11 and the second gate line IG11 may surround a side surface of the first lower wire pattern 110A and a side surface of the first upper wire pattern 110B. That is, each of the first lower wire pattern 110A and the first upper wire pattern 110B may extend in the first direction (e.g., the Y direction) and may extend through the first gate line PG11 and the second gate line IG11.

The third gate line IG12 may be spaced apart from the first gate line PG11 in the second direction X. The third gate line IG12 may extend in the second direction (e.g., the X direction) and may intersect the second lower wire pattern 210A and the second upper wire pattern 210B. The fourth gate line PG12 may be spaced apart from the second gate line IG11 in the second direction X. The fourth gate line PG12 may extend in the second direction (e.g., the X direction) and may intersect the second lower wire pattern 210A and the second upper wire pattern 210B.

Each of the third gate line IG12 and the fourth gate line PG12 may surround a side surface of the second lower wire pattern 210A and a side surface of the second upper wire pattern 210B. That is, each of the second lower wire pattern 210A and the second upper wire pattern 210B may extend in the first direction (e.g., the Y direction) and may extend through the third gate line IG12 and the fourth gate line PG12.

Each of the first to fourth gate lines PG11, IG11, IG12, and PG12 may include a gate dielectric film 120, a gate electrode 130, a gate spacer 140, and a gate capping pattern 150.

The gate electrode 130 may include, as examples, at least one of TiN, WN, TaN, Ru, TiC, TaC, Ti, Ag, Al, TiAl, TiAlN, TiAlC, TaCN, TaSiN, Mn, Zr, W, Al, and combinations thereof, with the understanding that the present disclosure is not limited thereto. The gate electrode 130 may be formed using a replacement process, with the understanding that the present disclosure is not limited thereto.

Although only a single layer is illustrated as the gate electrode 130, this is only an example. In some embodiments, the gate electrode 130 may be formed by stacking a plurality of conductive layers. For example, the gate electrode 130 may include a work function adjusting film that may control a work function, and a filling conductive film that fills or is within a space defined by the work function adjusting film. The work function adjusting film may include, for example, at least one of TiN, TaN, TiC, TaC, TiAlC, and/or combinations thereof. The filling conductive film may include, for example, W or Al.

The gate dielectric film 120 may be interposed between each of the wire patterns 110A, 110B, 210A and 210B and the gate electrode 130. Further, the gate dielectric film 120 may be interposed between the first pin-like pattern 111 and the gate electrode 130 and between the second pin-like pattern 211 and the gate electrode 130. The gate dielectric film 120 may extend along a top surface of the field insulating film 102.

The gate dielectric film 120 may include, for example, at least one of silicon oxide, silicon oxynitride, silicon nitride, or a high dielectric constant material having a higher dielectric constant than that of silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or combinations thereof, with the understanding that the present disclosure is not limited thereto.

Although not shown, in some embodiments an interface film may be formed between each of the wire patterns 110A, 110B, 210A, and 210B and the gate dielectric film 120. The interfacial film may include, for example, an oxide film, although the present disclosure is not limited thereto.

The gate spacer 140 may be formed on the substrate 100 and the field insulating film 102. The gate spacer 140 may extend along a side surface of the gate electrode 130. In some embodiments, the gate dielectric film 120 may further extend along an inner side surface of the gate spacer 140. For example, the gate dielectric film 120 may be interposed between the gate electrode 130 and the gate spacer 140. The gate dielectric film 120 may be formed using a replacement process, although the present disclosure is not limited thereto.

The gate spacer 140 may include, for example, at least one of silicon nitride, silicon oxynitride, silicon oxycarbide, silicon boron nitride, silicon boron carbonitride, silicon oxycarbonitride, and combinations thereof, with the understanding that the present disclosure is not limited thereto.

In some embodiments, a first inner spacer 145A may be formed on a side surface of the gate electrode 130 between adjacent ones of the first to third nanosheets 112, 113, and 114. The first inner spacer 145A may also be formed between the first pin-like pattern 111 and the first nanosheet 112.

The first inner spacer 145A may include, as non-limiting examples, at least one of silicon nitride, silicon oxynitride, silicon oxycarbide, silicon boron nitride, silicon boron carbonitride, silicon oxycarbonitride, and/or combinations thereof. The first inner spacer 145A may include the same material as that of the gate spacer 140, or may include a material different from that of the gate spacer 140.

In some embodiments, a second inner spacer 145B may be formed on a side surface of the gate electrode 130 between adjacent ones of the fourth to sixth nanosheets 115, 116, and 117. The second inner spacer 145B may include, as non-limiting examples, at least one of silicon nitride, silicon oxynitride, silicon oxycarbide, silicon boron nitride, silicon boron carbonitride, silicon oxycarbonitride, and combinations thereof. The second inner spacer 145B may include the same material as that of each of the first inner spacer 145A and/or gate spacer 140, or may include a material different from that of each of the first inner spacer 145A and/or the gate spacer 140.

The gate capping pattern 150 may extend along a top surface of the gate electrode 130. The gate capping pattern 150 may cover at least a portion of the top surface of the gate electrode 130. Although it is shown in the drawing that a top surface of the gate spacer 140 is coplanar with a top surface of the gate capping pattern 150, this is merely one example. In some embodiments, the gate capping pattern 150 may be formed to cover the top surface of the gate spacer 140. The gate capping pattern 150 may include, as non-limiting examples, at least one of silicon nitride, silicon oxynitride, silicon oxycarbide, silicon boron nitride, silicon boron carbonitride, silicon oxycarbonitride, and/or combinations thereof. The present disclosure is not limited thereto.

The source/drain areas 160A and 160B may be formed in the wire patterns 110A, 110B, 210A and 210B. Hereinafter, a manner in which the source/drain areas 160A and 160B may be formed in the first lower wire pattern 110A and the first upper wire pattern 110B will be described. However, those of ordinary skill in the art to which the present disclosure pertains will understand that the source/drain areas 160A and 160B may also be formed in the second lower wire pattern 210A and the second upper wire pattern 210B similarly to the manner described herein.

The source/drain areas 160A and 160B may be formed on side surfaces of the first to fourth gate lines PG11, IG11, IG12, and PG12 and on side surfaces of the fifth to eighth gate lines PG21, IG21, IG22, and PG22. The source/drain areas 160A and 160B may be electrically separated from the gate electrode 130 via the gate spacer 140.

The source/drain areas 160A and 160B may include a lower source/drain area 160A formed in the first lower wire pattern 110A and an upper source/drain area 160B formed in the first upper wire pattern 110B. The lower source/drain area 160A may be connected to the first lower wire pattern 110A, and the upper source/drain area 160B may be connected to the first upper wire pattern 110B.

Each of the source/drain areas 160A and 160B may include an epitaxial layer. For example, each of the source/drain areas 160A and 160B may be formed using an epitaxial growth method. In some embodiments, a cross section of each of the source/drain areas 160A and 160B intersecting the second direction X may have a diamond shape (or a pentagonal shape, or a hexagonal shape).

The lower source/drain area 160A may have a first conductivity type, and the upper source/drain area 160B may have a second conductivity type different from that of the lower source/drain area 160A. In some examples of embodiments, the first conductivity type may be a n-type and the second conductivity type may be a p-type. In this case, the first lower wire pattern 110A and the second lower wire pattern 210A may be used as a channel area of NFET, and the first upper wire pattern 110B and the second upper wire pattern 210B may be used as a channel area of PFET. However, this is only one example, and in some embodiments the first conductivity type may be a p-type and the second conductivity type may be a n-type.

When a semiconductor memory device including the first lower wire pattern 110A and the second lower wire pattern 210A is NFET, the lower source/drain area 160A may contain an n-type impurity or an impurity for preventing diffusion of the n-type impurity. For example, the lower source/drain area 160A may contain at least one of P, Sb, As, and/or combinations thereof.

In some embodiments, the lower source/drain area 160A may include a tensile stress material. For example, when each of the first lower wire pattern 110A and the second lower wire pattern 210A includes silicon (Si), the lower source/drain area 160A may include a material (e.g., SiC) that has a lattice constant smaller than that of silicon (Si). The tensile stress material may apply tensile stress to the first lower wire pattern 110A and the second lower wire pattern 210A to improve carrier mobility in the channel area.

When the semiconductor memory device including the first upper wire pattern 110B and the second upper wire pattern 210B is PFET, the upper source/drain area 160B may contain a p-type impurity or an impurity for preventing diffusion of the p-type impurity. For example, the lower source/drain area 160A may contain at least one of B, C, In, Ga, Al, and/or combinations thereof.

In some embodiments, the upper source/drain area 160B may include a compressive stress material. For example, when each of the first upper wire pattern 110B and the second upper wire pattern 210B includes silicon (Si), the upper source/drain area 160B may include a material having a lattice constant larger than that of silicon (Si). For example, the upper source/drain area 160B may include silicon germanium (SiGe). The compressive stress material may apply compressive stress to the first lower wire pattern 110A and the second lower wire pattern 210A to improve carrier mobility in the channel area.

The separating insulating film 170 may be formed on the substrate 100 and the field insulating film 102. The separating insulating film 170 may cover the lower source/drain area 160A. The upper source/drain area 160B may be formed on the separating insulating film 170. The separating insulating film 170 may include a first separating portion 172 and a second separating portion 174.

The first separating portion 172 may electrically separate the lower source/drain area 160A and the upper source/drain area 160B from each other. For example, the first separating portion 172 may be between the first gate line PG11 and the second gate line IG11, and may electrically separate the lower source/drain area 160A and the upper source/drain area 160B between the first gate line PG11 and the second gate line IG11 from each other.

The second separating portion 174 may separate the first unit element I and the second unit element II from each other. For example, the second separating portion 174 may be interposed between the first gate line PG11 and the fifth gate line PG21 (and between the third gate line IG12 and the seventh gate line IG22) to separate the first unit element I and the second unit element II from each other.

In some embodiments, the first separating portion 172 and the second separating portion 174 may be monolithic with each other. That is, the first separating portion 172 and the second separating portion 174 may be formed using the same manufacturing process and may have the same material composition.

In some embodiments, a vertical level of a top surface of the second separating portion 174 may be higher than that of a top surface of the first separating portion 172. For example, as shown in FIG. 3, a vertical dimension H1 of the second separating portion 174 (as measured from an upper surface of the lower source/drain area 160A to an upper surface of the second separating portion 174) may be larger than a vertical dimension H2 of the first separating portion 172 (as measured from the upper surface of the lower source/drain area 160A to an upper surface of the first separating portion 172).

In some embodiments, a vertical level of the top or upper surface of the second separating portion 174 may be higher than or equal to that of a top surface of the first upper wire pattern 110B (and a top surface of the second upper wire pattern 210B). In this case, the upper source/drain area 160B may not be interposed between the first gate line PG11 and the fifth gate line PG21 (and between the third gate line IG12 and the seventh gate line IG22).

The separating insulating film 170 may include, for example, at least one of silicon oxide, silicon nitride, silicon oxynitride, silicon oxycarbide, silicon boron nitride, silicon boron carbonitride, silicon oxycarbonitride, and/or a low dielectric constant material. The low dielectric constant material may include, for example, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, a porous polymeric material, and/or combinations thereof, with the understanding that the present disclosure is not limited to these examples.

The interlayer insulating films 310 and 320 may cover the first to fourth gate lines PG11, IG11, IG12, and PG12, the fifth to eighth gate lines PG21, IG21, IG22, and PG22, the source/drain areas 160A and 160B and the separating insulating film 170. Each of the interlayer insulating films 310 and 320 may include, for example, at least one of silicon oxide, silicon oxynitride, and/or a low dielectric constant material. In some embodiments, the interlayer insulating films 310 and 320 may include a first interlayer insulating film 310 and a second interlayer insulating film 320 that are sequentially stacked.

The first interlayer insulating film 310 may cover a top surface of the separating insulating film 170, a side surface of each of the first to fourth gate lines PG11, IG11, IG12, and PG12, a side surface of each of the fifth to eighth gate lines PG21, IG21, IG22, and PG22, and a top surface of the upper source/drain area 160B. In some embodiments, a top surface of the first interlayer insulating film 310 may be coplanar with a top surface of each of the first to fourth gate lines PG11, IG11, IG12, and PG12 and a top surface of each of the fifth to eighth gate lines PG21, IG21, IG22, and PG22.

The second interlayer insulating film 320 may cover a top surface of the first interlayer insulating film 310, a top surface of each of the first to fourth gate lines PG11, IG11, IG12, and PG12, and a top surface of each of the fifth to eighth gate lines PG21, IG21, IG22, and PG22.

The first gate line PG11 and/or the fourth gate line PG12 may further include a recess capping pattern 155. Hereinafter, a manner in which the recess capping pattern 155 of the first gate line PG11 is formed is described. However, those of ordinary skill in the art to which the present disclosure pertains will understand that the recess capping pattern 155 of the fourth gate line PG12 may also be formed similarly to the manner described herein.

The recess capping pattern 155 may cover at least a portion of a top surface of the gate electrode 130 that overlaps the first overlapping contact 190A which will be described later. Herein, the term "overlapping" or "overlap" may refer to overlapping in the third direction Z that intersects the top surface of the substrate 100. For example, the recess capping pattern 155 may extend along a portion of a top surface of the gate electrode 130 of the first gate line PG11 around the first upper wire pattern 110B. In some embodiments, the gate capping pattern 150 of the first gate line PG11 may extend along a portion of a top surface of the gate electrode 130 of the first gate line PG11 where the recess capping pattern 155 is not formed.

In some embodiments, the top surface of the recess capping pattern 155 may be coplanar with the top surface of the gate capping pattern 150. For example, both the top surface of the recess capping pattern 155 and the top surface of the gate capping pattern 150 may be coplanar with the top surface of the first interlayer insulating film 310.

A vertical level of a bottom surface of the recess capping pattern 155 may be lower than that of a bottom surface of the gate capping pattern 150. For example, as shown in FIG. 5, a depth D2 of the bottom surface of the recess capping pattern 155 from the top surface of the first interlayer insulating film 310 may be greater than a depth D1 of the bottom surface of the gate capping pattern 150 from the top surface of the first interlayer insulating film 310.

In some embodiments, the vertical level of the bottom surface of the recess capping pattern 155 may be higher than or equal to that of a top surface of the first upper wire pattern 110B (and a top surface of the second upper wire pattern 210B).

In some embodiments, the gate spacer 140 may be interposed between the recess capping pattern 155 and the first interlayer insulating film 310.

The recess capping pattern 155 may include, for example, at least one of silicon nitride, silicon oxynitride, silicon oxycarbide, silicon boron nitride, silicon boron carbonitride, silicon oxycarbonitride, and/or combinations thereof, with the understanding that the present disclosure is not limited thereto. In some embodiments, the recess capping pattern 155 may include the same material as that of the gate capping pattern 150.

FIG. 5 shows that no boundary is formed between the recess capping pattern 155 and the gate capping pattern 150, however the present disclosure is not limited thereto. In some embodiments, a boundary may be present between the recess capping pattern 155 and the gate capping pattern 150, depending on a formation method of the recess capping pattern 155 and the gate capping pattern 150.

The first gate line PG11 may act as a gate electrode of the first pass transistor (PS1 of FIG. 1). For example, as shown in FIG. 5, a first gate contact 182a may extend through the second interlayer insulating film 320 and the gate capping pattern 150 and be connected to the gate electrode 130 of the first gate line PG11. The first gate contact 182a may act as a node of the word-line (WL of FIG. 1). Thus, the first pass transistor (PS1 of FIG. 1) may be connected to the word-line (WL of FIG. 1).

The first lower wire pattern 110A that intersects the first gate line PG11 may act as a channel area of the first pass transistor (PS1 of FIG. 1). For example, as shown in FIG. 4, a first source/drain contact 181 connected to the lower source/drain area 160A may be formed between the first gate line PG11 and the fifth gate line PG21. The first source/drain contact 181 may act as a node of the bit-line (BL of FIG. 1). Thus, the first pass transistor (PS1 of FIG. 1) may be connected to the bit-line (BL of FIG. 1).

In some embodiments, the first source/drain contact 181 may extend in the third direction Z and may extend through the second interlayer insulating film 320, the first interlayer insulating film 310, and the second separating portion 174 of the separating insulating film 170. As described above, and as best seen in FIG. 4, due to the second separating portion 174, the upper source/drain area 160B may not be formed between the first gate line PG11 and the fifth gate line PG21. Thus, the first source/drain contact 181 may be connected to the lower source/drain area 160A while not being connected to the upper source/drain area 160B.

The second gate line IG11 may act as a gate electrode of the first inverter (INV1 of FIG. 1). Further, the first upper wire pattern 110B intersecting the second gate line IG11 may act as a channel area of the first pull-up transistor (PU1 of FIG. 1). For example, as shown in FIG. 3, a second source/drain contact 184a connected to the upper source/drain area 160B may be formed at one side around the second gate line IG11. The second source/drain contact 184a may act as the power node ($V_{DD}$ of FIG. 1).

Further, the first lower wire pattern 110A that intersects the second gate line IG11 may act as a channel area of the first pull-down transistor (PD1 of FIG. 1). For example, as shown in FIG. 4, a third source/drain contact 185a connected to the lower source/drain area 160A may be formed at one side around the second gate line IG11. The third source/drain contact 185a may act as the ground node ($V_{SS}$ FIG. 1).

In some embodiments, a contact insulating film 175 may be formed that electrically separates the third source/drain contact 185a from the upper source/drain area 160B. The contact insulating film 175 may extend along, for example, a side surface of the third source/drain contact 185a. Due to the contact insulating film 175, the third source/drain contact 185a may be connected to the lower source/drain area 160A while not being connected to the upper source/drain area 160B.

The lower source/drain area 160A and the upper source/drain area 160B between the first gate line PG11 and the second gate line IG11 may act as the output node of the first inverter (INV1 of FIG. 1). For example, as shown in FIG. 3, a first common contact 183 connecting the lower source/drain area 160A and the upper source/drain area 160B to each other may be formed between the first gate line PG11 and the second gate line IG11. Thus, the output node of the first inverter (INV1 of FIG. 1) may be connected to the first pass transistor PS1. Further, the first inverter (INV1 of FIG. 1) may be connected to and between the power node ($V_{DD}$ of FIG. 1) and the ground node ($V_{SS}$ of FIG. 1).

In some embodiments, the first common contact 183 may extend in the third direction Z and extend through the upper source/drain area 160B and the first separating portion 172 of the separating insulating film 170.

The first lower wire pattern 110A that intersects the first gate line PG11 may act as a channel area of the first pass transistor (PS1 of FIG. 1). For example, as shown in FIG. 4, the first source/drain contact 181 connected to the lower source/drain area 160A may be formed between the first gate line PG11 and the fifth gate line PG21. The first source/drain contact 181 may act as a node of the bit-line (BL of FIG. 1). Thus, the first pass transistor (PS1 of FIG. 1) may be connected to the bit-line (BL of FIG. 1).

The fourth gate line PG12 may act as a gate electrode of the second pass transistor (PS2 of FIG. 1). For example, as shown in FIG. 2, a second gate contact 182b connected to the fourth gate line PG12 may be formed. The second gate contact 182b may act as a node of the word-line (WL of FIG. 1). Thus, the second pass transistor (PS2 of FIG. 1) may be connected to the word-line (WL of FIG. 1).

The second lower wire pattern 210A that intersects the fourth gate line PG12 may act as a channel area of the second pass transistor (PS2 of FIG. 1). For example, as shown in FIG. 2, a fourth source/drain contact 186 connected to a source/drain area (e.g., the lower source/drain area 160A) of the second lower wire pattern 210A may be formed at one side around the fourth gate line PG12. The fourth source/drain contact 186 may act as a node of the complementary bit-line (/BL of FIG. 1). Thus, the second pass transistor (PS2 of FIG. 1) may be connected to the complementary bit-line (/BL of FIG. 1). Because the fourth source/drain contact 186 may be similar to the first source/drain contact 181, detailed description thereof will be omitted herein.

The third gate line IG12 may act as the gate electrode of the second inverter (INV2 of FIG. 1). Further, the second upper wire pattern 210B that intersects the third gate line IG12 may act as a channel area of the second pull-up transistor (PU2 of FIG. 1). For example, as shown in FIG. 2, a fifth source/drain contact 184b connected to a source/drain area (e.g., the upper source/drain area 160B) of the second upper wire pattern 210B may be formed at one side around the third gate line IG12. The fifth source/drain contact 184b may act as the power node ($V_{DD}$ of FIG. 1). Because the fifth source/drain contact 184b may be similar to the second source/drain contact 184a, detailed description thereof will be omitted herein.

Further, the second lower wire pattern 210A intersecting the third gate line IG12 may act as a channel area of the second pull-down transistor (PD2 of FIG. 1). For example, as shown in FIG. 2, a sixth source/drain contact 185b connected to a source/drain area (e.g., the lower source/drain area 160A) of the second lower wire pattern 210A may be formed at one side around the third gate line IG12. The sixth source/drain contact 185b may act as the ground node ($V_{SS}$ of FIG. 1). Because the sixth source/drain contact 185b may be similar to the third source/drain contact 185a, detailed description thereof will be omitted herein.

Source/drain areas (e.g., the lower source/drain area 160A and the upper source/drain area 160B) between the third gate line IG12 and the fourth gate line PG12 may act as an output node of the second inverter (INV2 of FIG. 1). For example, as shown in FIG. 2, a second common contact 187 connecting the source/drain areas (e.g., the lower source/drain area 160A and the upper source/drain area 160B) to each other may be formed between the third gate line IG12 and the fourth gate line PG12. Thus, the output node of the second inverter (INV2 of FIG. 1) may be connected to the second pass transistor PS2. Further, the second inverter (INV2 of FIG. 1) may be connected to and between the power node ($V_{DD}$ of FIG. 1) and the ground node ($V_{SS}$ of FIG. 1).

The first overlapping contact 190A may electrically connect the source/drain areas 160A and 160B between the first gate line PG11 and the second gate line IG11 to each other and may be connected to the third gate line IG12. For example, the first overlapping contact 190A may extend through the second interlayer insulating film 320 to connect the first common contact 183 and the gate electrode 130 of the third gate line IG12 to each other. Thus, the input node of the second inverter (INV2 of FIG. 1) may be connected to the output node of the first inverter (INV1 of FIG. 1).

At least a portion of the first overlapping contact 190A may overlap at least a portion of the first gate line PG11. For example, as shown in FIGS. 1 and 3, a portion of the first overlapping contact 190A may overlap a portion of the gate electrode 130 of the first gate line PG11 around the first upper wire pattern 110B.

A vertical level of a bottom surface of the first overlapping contact 190A may be higher than a vertical level of a bottom surface of the recess capping pattern 155. Thus, although the first overlapping contact 190A partially overlaps with the first gate line PG11, the contact 190A may be electrically isolated from the gate electrode 130 of the first gate line PG11. Specifically, as shown in FIG. 5, the first overlapping contact 190A may be spaced apart from the gate electrode 130 of the first gate line PG11 via the recess capping pattern 155.

In some embodiments, a portion of the first overlapping contact 190A may overlap at least a portion of the third gate line IG12. For example, as shown in FIG. 2, the portion of the first overlapping contact 190A may overlap one end of the third gate line IG12.

In some embodiments, a vertical level of the bottom surface of the first overlapping contact 190A may be lower than or equal to that of the bottom surface of the gate capping pattern 150 and higher than that of the bottom surface of the recess capping pattern 155. Thus, as shown in FIG. 5, the first overlapping contact 190A may be connected to the gate electrode 130 of the third gate line IG12 while not being connected to the gate electrode 130 of the first gate line PG11.

In some embodiments, the first overlapping contact 190A may include a first extension portion 192 that extends in the first direction (e.g., the Y direction) and the second extension portion 194 that extends in the second direction (e.g., the X direction). The first extension portion 192 may extend in the first direction and overlap a portion of the first lower wire pattern 110A and a portion of the first upper wire pattern 110B. The first extension portion 192 may be connected to the first common contact 183. The second extension portion 194 may extend from the first extension portion 192 in the second direction and overlap a portion of the first gate line PG11 and a portion of the third gate line IG12. The second extension portion 194 may be connected to the gate electrode 130 of the third gate line IG12. Thus, the first overlapping contact 190A may electrically connect the first common contact 183 and the third gate line IG12 to each other.

The second overlapping contact 190B may electrically connect the source/drain areas (e.g., the lower source/drain area 160A and the upper source/drain area 160B) between the third gate line IG12 and the fourth gate line PG12 to each other, and may be electrically connected to the second gate line IG11. For example, the second overlapping contact 190B may connect the second common contact 187 and the gate electrode 130 of the second gate line IG11 to each other. Thus, the input node of the first inverter (INV1 of FIG. 1) may be connected to the output node of the second inverter (INV2 of FIG. 1).

In some embodiments, the second overlapping contact 190B may be at the same vertical level as that of the first overlapping contact 190A. For example, a top surface of the second overlapping contact 190B may be coplanar with a top surface of the first overlapping contact 190A.

In some embodiments, at least a portion of the second overlapping contact 190B may overlap at least a portion of the fourth gate line PG12. Because a shape of the second overlapping contact 190B may be similar to that of the first overlapping contact 190A, detailed description thereof will be omitted herein.

In some embodiments, the second overlapping contact 190B may include a third extension portion 197 that extends in the first direction (e.g., the Y direction) and a fourth extension portion 199 that extends in the second direction (e.g., the X direction). The third extension portion 197 may extend in the first direction and overlap a portion of the second lower wire pattern 210A and a portion of the second upper wire pattern 210B. The third extension portion 197 may be connected to the second common contact 187. The fourth extension portion 199 may extend in the second direction from the third extension portion 197 and overlap a portion of the second gate line IG11 and a portion of the fourth gate line PG12. The fourth extension portion 199 may be connected to the gate electrode 130 of the second gate line IG11. Thus, the second overlapping contact 190B may electrically connect the second common contact 187 and the second gate line IG11 to each other.

In some embodiments, the first overlapping contact 190A and the second overlapping contact 190B may be formed symmetrically with each other around a center of the first unit element I in a plan view.

As an integration density of the semiconductor memory devices increases, individual circuit patterns are becoming more miniatured in order to implement a larger number of semiconductor memory devices in the same area. To this end, semiconductor memory devices using a multi-gate transistor are being studied. However, it may be difficult to improve the integration density of such a semiconductor memory device due to complexity of circuit patterns thereof.

The semiconductor memory device according to some embodiments may include the first overlapping contact 190A that overlaps the first gate line PG11, which may improve the integration density of the semiconductor memory device. Specifically, as described above, the first gate line PG11 may include the recess capping pattern 155 that has a larger depth than that of the gate capping pattern 150. Due to this recess capping pattern 155, the first overlapping contact 190A may be prevented from electrical connection with the first gate line PG11 even through the contact 190A overlaps with the first gate line PG11. Thus, the semiconductor memory device having an improved integration density may be realized.

Figure 6:
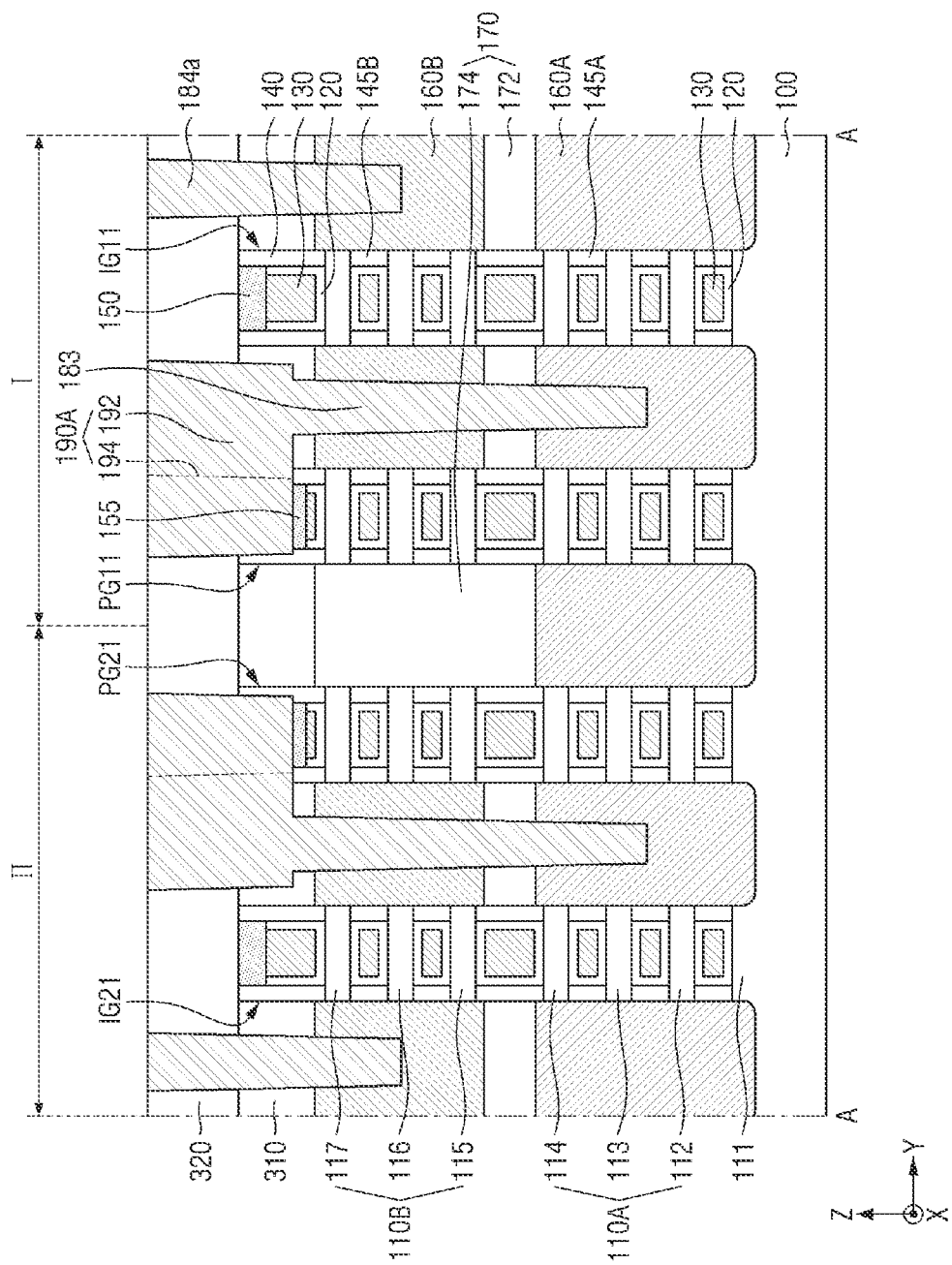
FIGS. 6 to 8 are various cross-sectional views for illustrating a semiconductor memory device according to some embodiments.
Figure 7:
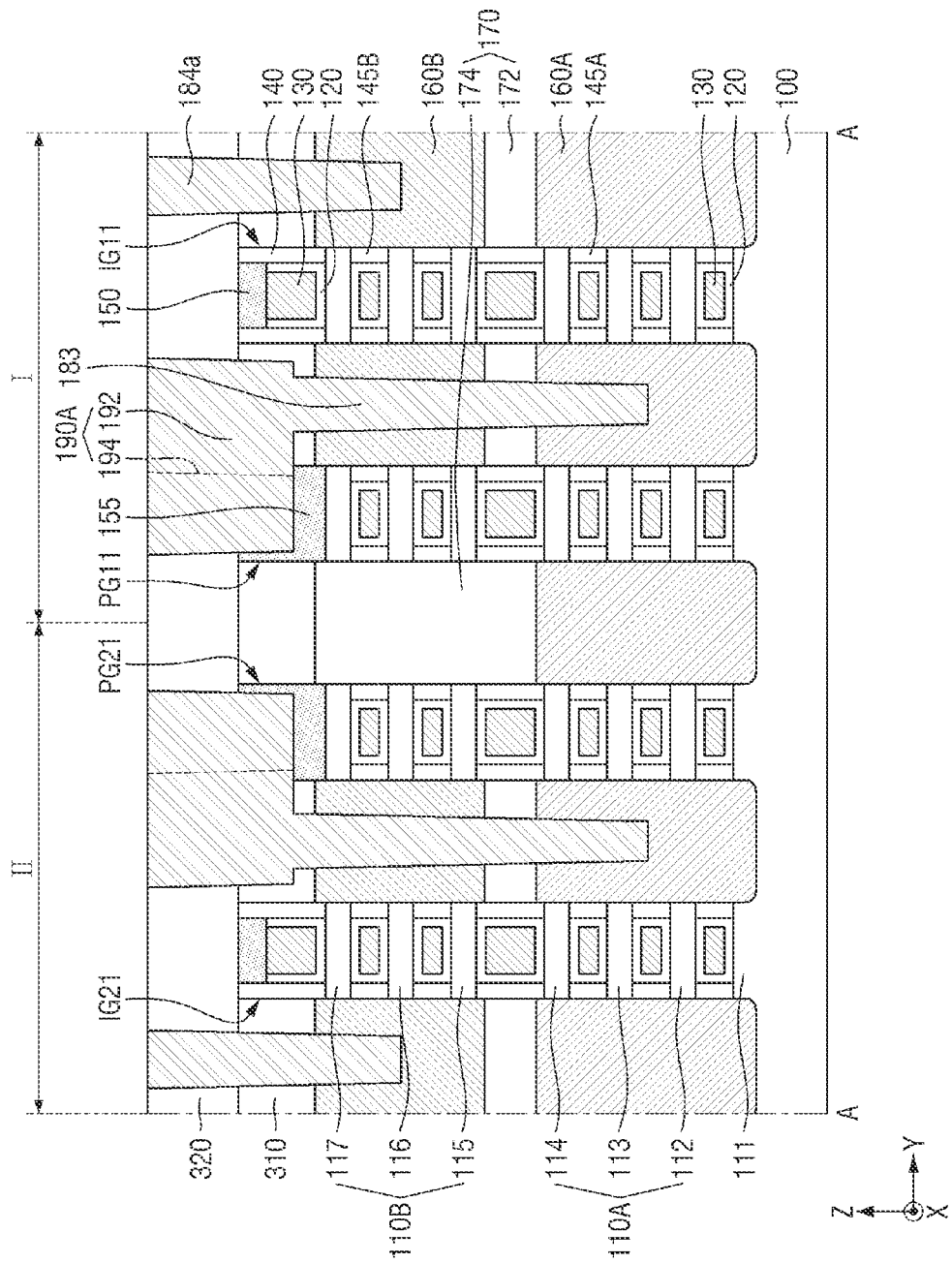
Figure 8:
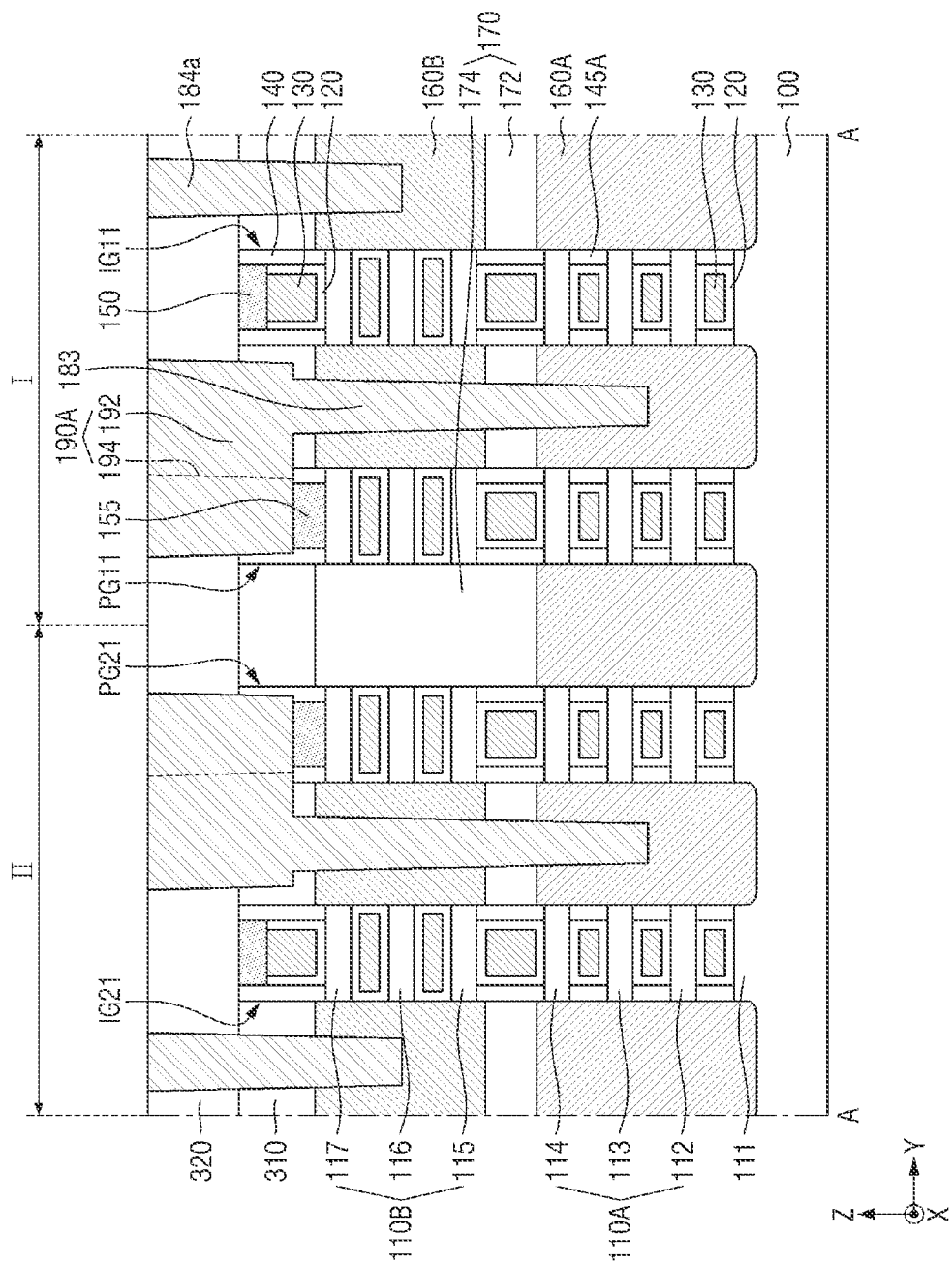

FIGS. 6 to 8 are various cross-sectional views for illustrating a semiconductor memory device according to some embodiments. For convenience of description, descriptions of the same components and configurations as those discussed with respect to FIGS. 1 to 5 are only briefly provided or omitted altogether.

Referring to FIG. 6, in a semiconductor memory device according to some embodiments, a vertical level of a bottom surface of the recess capping pattern 155 may be higher than that of a top surface of the first upper wire pattern 110B (and a top surface of the second upper wire pattern 210B).

In this case, a portion of the gate electrode 130 of the first gate line PG11 may be interposed between the first upper wire pattern 110B and the recess capping pattern 155. For example, the portion of the gate electrode 130 of the first gate line PG11 may extend along a top surface of the sixth nanosheet 117.

Referring to FIG. 7, in a semiconductor memory device according to some embodiments, the gate spacer 140 is not interposed between the recess capping pattern 155 and the first interlayer insulating film 310.

For example, a side surface of the recess capping pattern 155 may contact the first interlayer insulating film 310. In some embodiments, a lower side surface of the recess capping pattern 155 may contact an upper side surface of the upper source/drain area 160B.

Referring to FIG. 8, a semiconductor memory device according to some embodiments may omit the second inner spacer (145B in FIGS. 3 and 4).

The upper source/drain area 160B may be electrically separated from the gate electrode 130 via the gate dielectric film 120. In some embodiments, the lower source/drain area 160A may include n-type impurities, and the upper source/drain area 160B may include p-type impurities.

Figure 9:
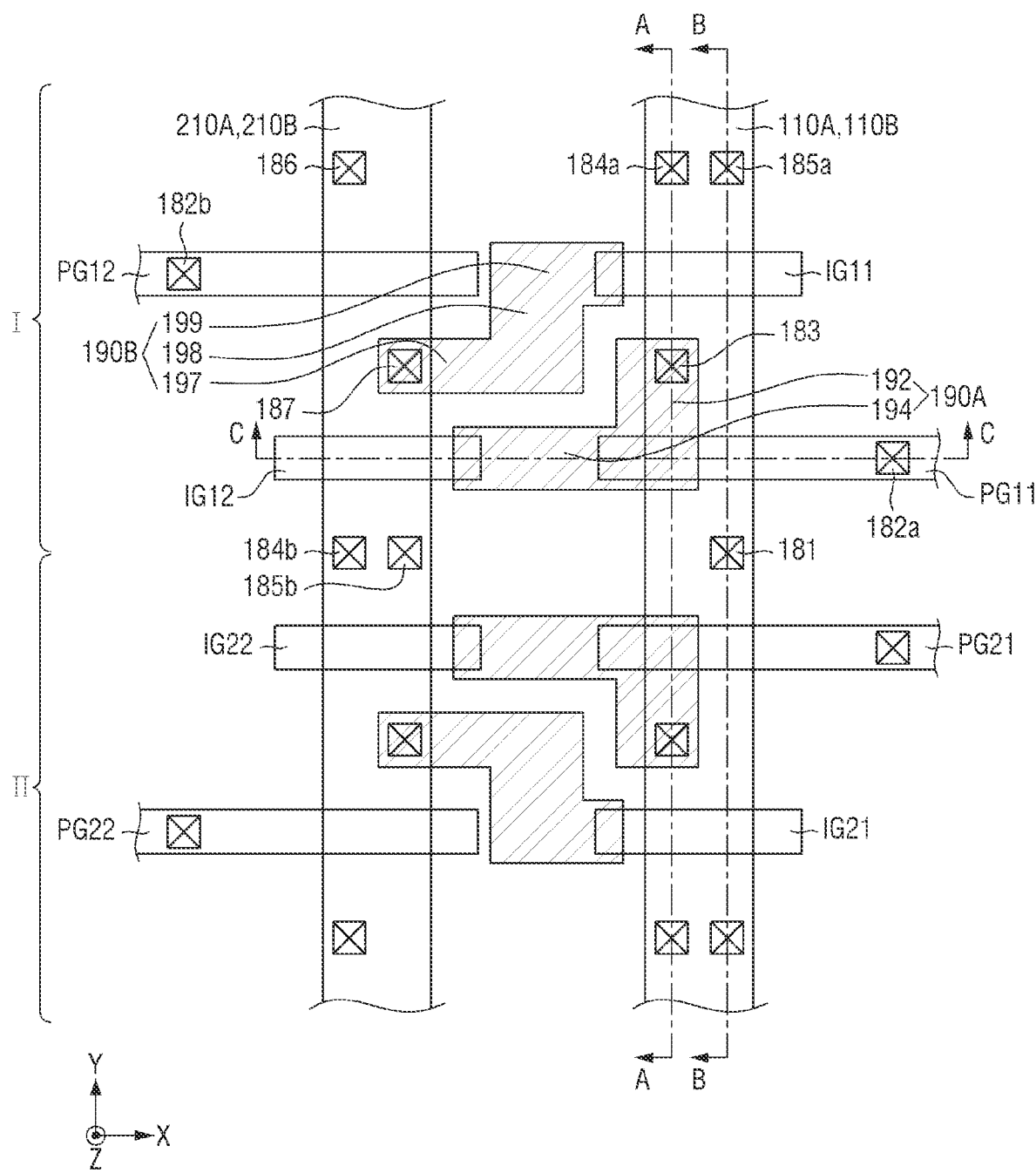
FIG. 9 is an exemplary layout diagram for illustrating a semiconductor memory device according to some embodiments.

FIG. 9 is an exemplary layout diagram for illustrating a semiconductor memory device according to some embodiments. For convenience of description, the descriptions of some components and configurations similar to those described with reference to FIGS. 1 to 5 are only briefly provided or omitted altogether.

Referring to FIG. 9, in a semiconductor memory device according to some embodiments, the second overlapping contact 190B may not overlap the fourth gate line PG12.

For example, the second overlapping contact 190B may include a third extension portion 197, a fourth extension portion 199, and a connective portion 198. The third extension portion 197 may extend in the second direction (e.g., the X direction) and be connected to the second common contact 187. The third extension portion 197 may not overlap the fourth gate line PG12. The fourth extension portion 199 may extend in the second direction and may be connected to the second gate line IG11. The fourth extension portion 199 may not overlap the fourth gate line PG12. The connective portion 198 may extend in the first direction and connect the third extension portion 197 and the fourth extension portion 199 to each other. The connective portion 198 may not overlap the second gate line IG11 and the fourth gate line PG12.

In some embodiments, the second overlapping contact 190B may not overlap the fourth gate line PG12. Thus, the fourth gate line PG12 may not include the recess capping pattern 155.

Only a configuration in which the first overlapping contact 190A overlaps the first gate line PG11 and the second overlapping contact 190B does not overlap the fourth gate line PG12 has been described. However, in some embodiments, the first overlapping contact 190A may not overlap the first gate line PG11 and the second overlapping contact 190B may overlap the fourth gate line PG12.

Figure 10:
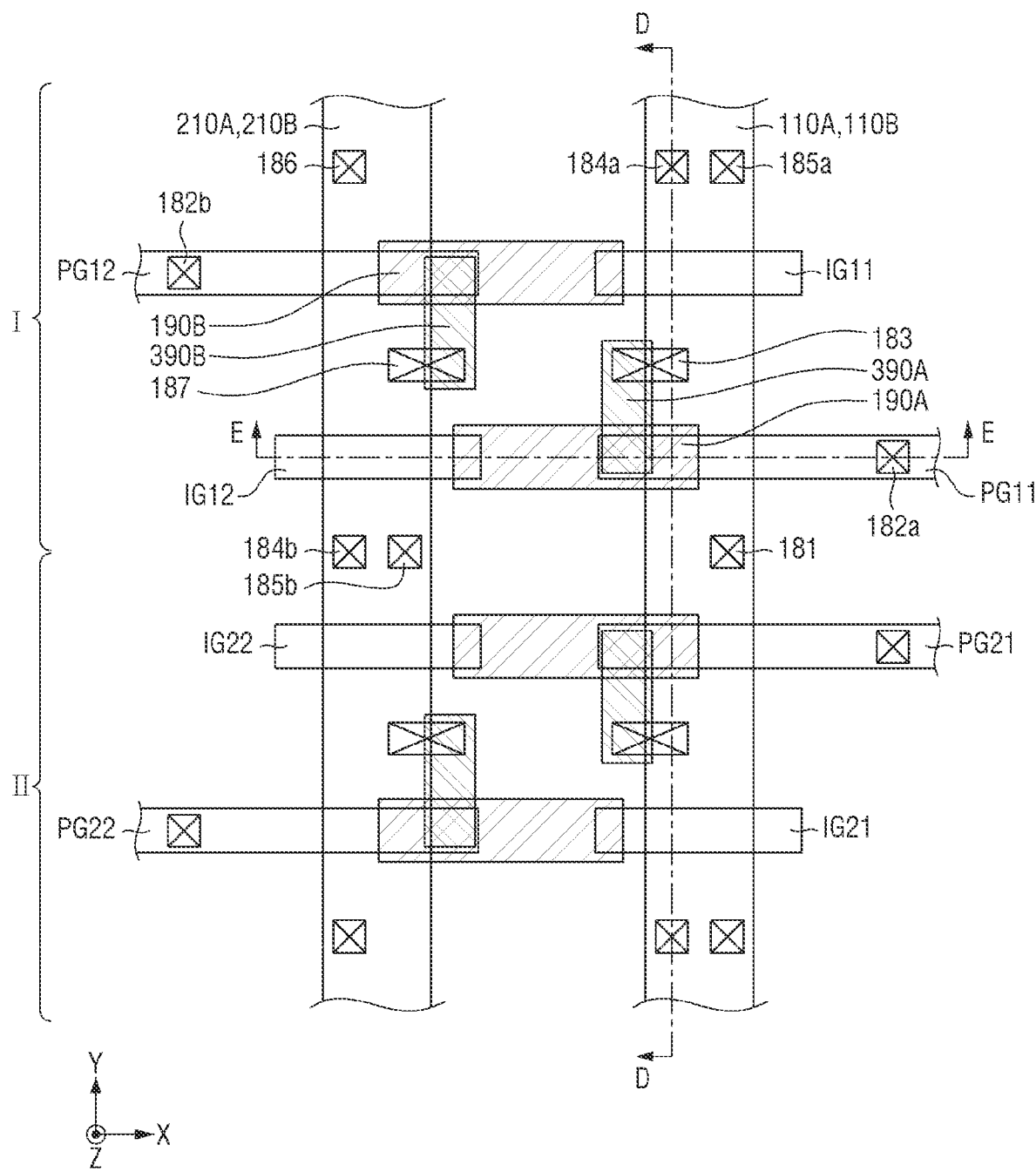
FIG. 10 is an exemplary layout diagram for illustrating a semiconductor memory device according to some embodiments.
Figure 11:
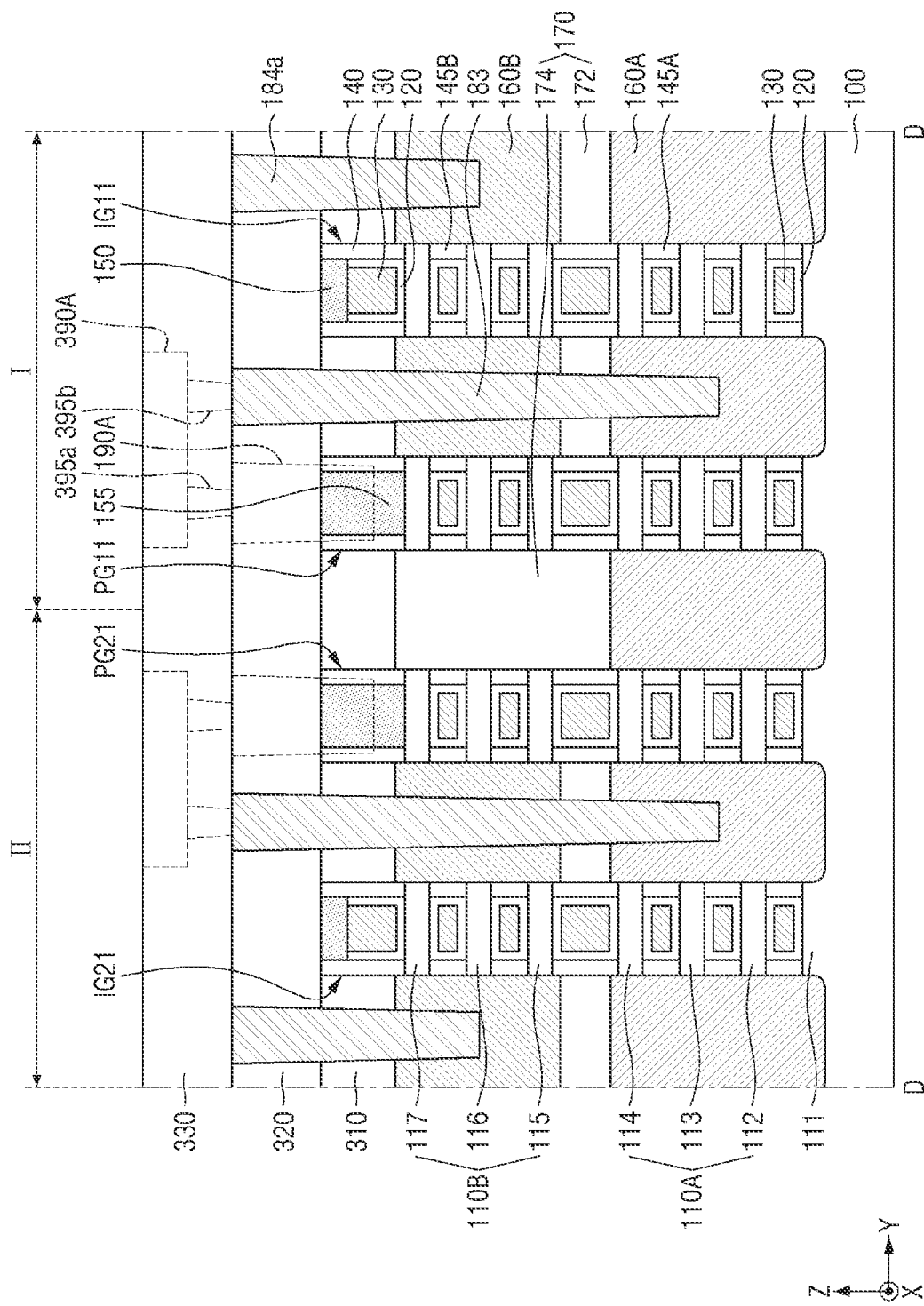
FIG. 11 is a cross-sectional view taken along a line D-D of FIG. 10.
Figure 12:
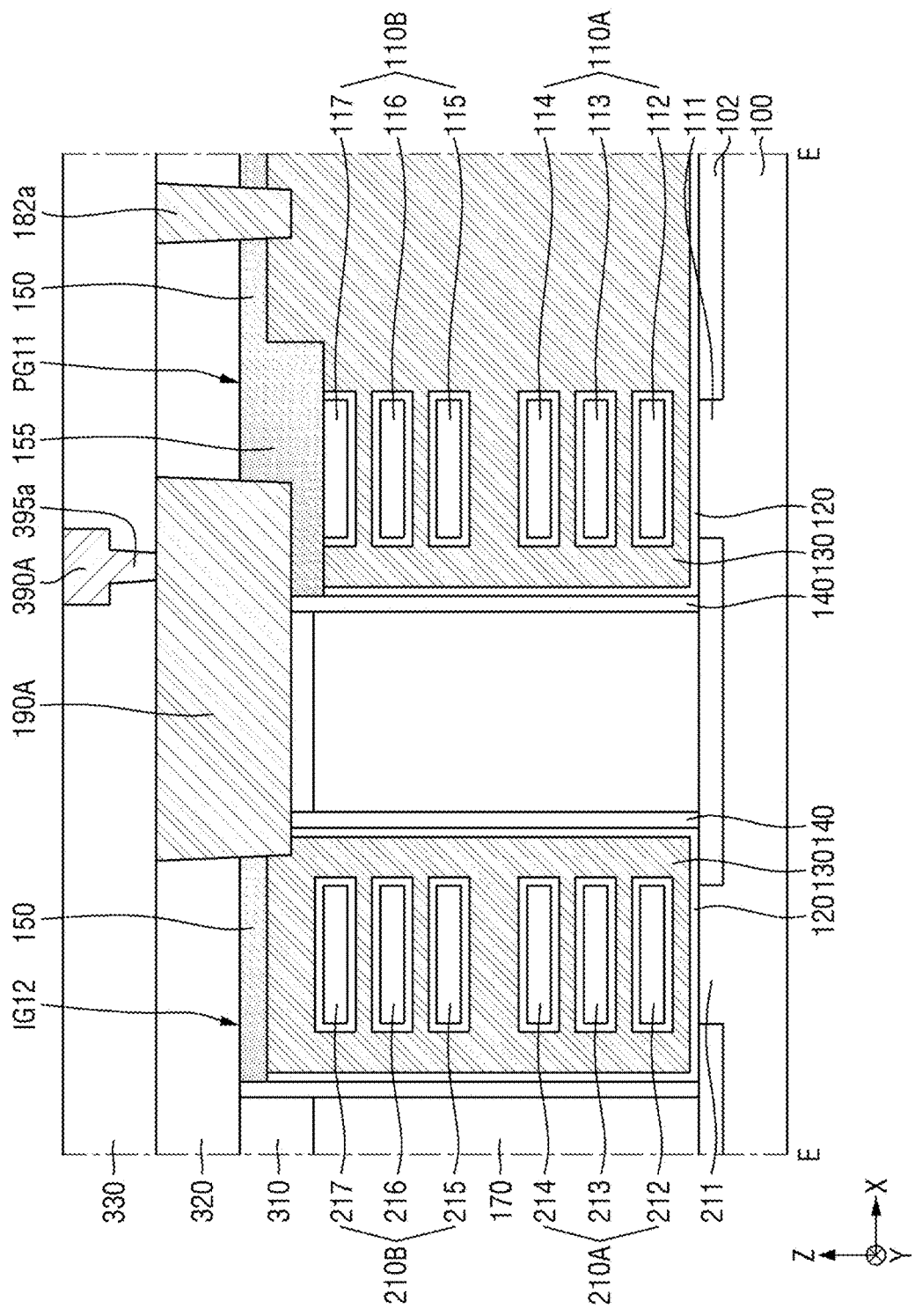
FIG. 12 is a cross-sectional view taken along a line E-E of FIG. 10.

FIG. 10 is an exemplary layout diagram for illustrating a semiconductor memory device according to some embodiments. FIG. 11 is a cross-sectional view taken along a line D-D of FIG. 10. FIG. 12 is a cross-sectional view taken along a line E-E of FIG. 10.

Referring to FIG. 10 to FIG. 12, a semiconductor memory device according to some embodiments may include a first wiring pattern 390A.

The first wiring pattern 390A may electrically connect the first overlapping contact 190A and the first common contact 183 to each other. For example, the first wiring pattern 390A may extend in the first direction (e.g., the Y direction) and overlap a portion of the first overlapping contact 190A and a portion of the first common contact 183.

In some embodiments, the first wiring pattern 390A may be at a higher vertical level than that of each of the first overlapping contact 190A and the first common contact 183. For example, a third interlayer insulating film 330 may be formed that covers the first overlapping contact 190A, the first common contact 183 and the second interlayer insulating film 320. The first wiring pattern 390A may be formed in the third interlayer insulating film 330 to connect the first overlapping contact 190A and the first common contact 183 to each other.

In some embodiments, a first via pattern 395$a$ and a second via pattern 395$b$ may be formed in the third interlayer insulating film 330. The first via pattern 395$a$ may extend through the third interlayer insulating film 330 and connect the first overlapping contact 190A with the first wiring pattern 390A. The second via pattern 395$b$ may extend through the third interlayer insulating film 330 and connect the first common contact 183 with the first wiring pattern. 390A. Thus, the first overlapping contact 190A and the first common contact 183 may be electrically connected to each other.

In some embodiments, a second wiring pattern 390B may be formed that electrically connects the second overlapping contact 190B with the second common contact 187. Because the second wiring pattern 390B may be similar to the first wiring pattern 390A, detailed description thereof will be omitted herein.

FIG. 13 to FIG. 25 are diagrams showing intermediate steps for illustrating a method for manufacturing a semiconductor memory device according to some embodiments. For convenience of description, descriptions of some components and configurations described with reference to FIGS. 1 to 5 are briefly provided or omitted altogether.

Figure 13:
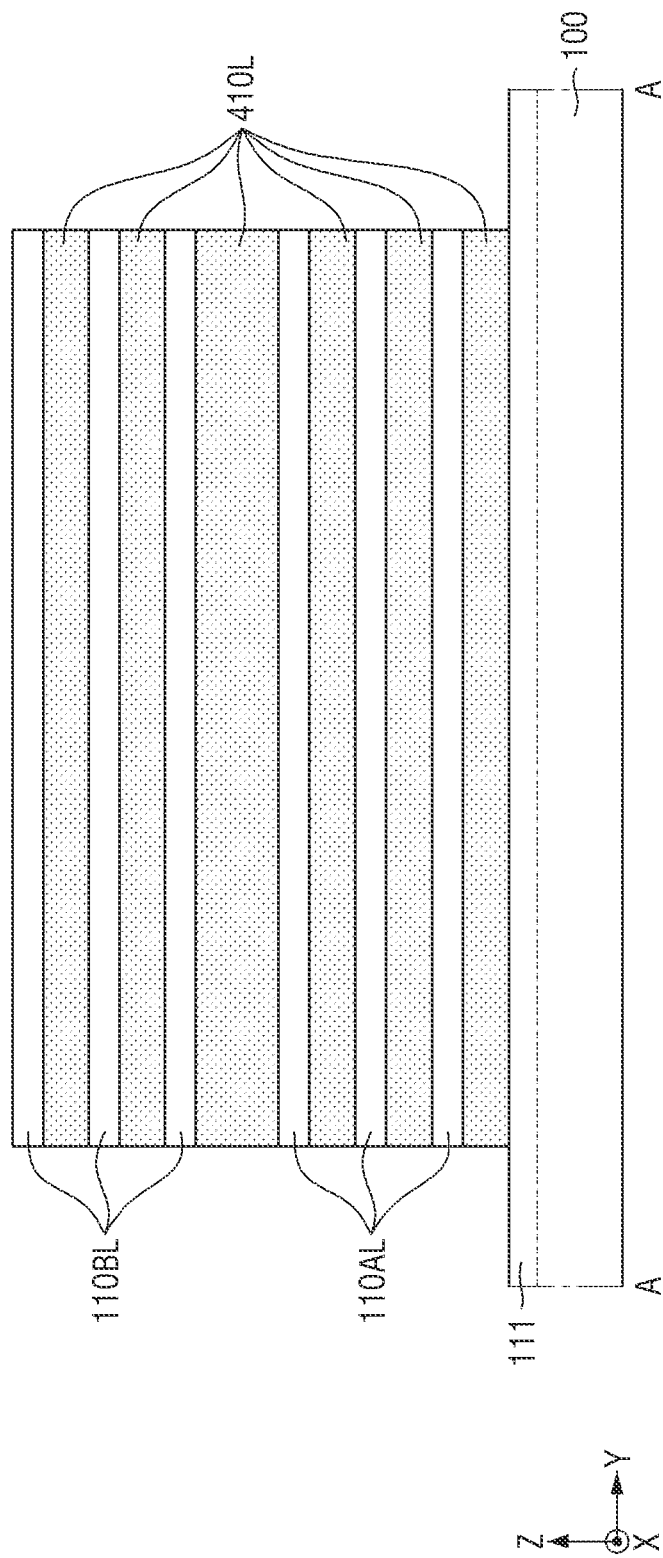
FIG. 13 to FIG. 25 are diagrams showing intermediate steps for illustrating operations of a method for manufacturing a semiconductor memory device according to some embodiments.

Referring to FIG. 13, a lower active pattern 110AL, an upper active pattern 110BL, and a preliminary sacrificial pattern 410L may be formed on a substrate 100.

The lower active pattern 110AL and the upper active pattern 110BL may be sequentially stacked on the substrate 100. The preliminary sacrificial pattern 410L may be on the substrate 100 and may be alternately and vertically arranged with the lower active pattern 110AL and the upper active pattern 110BL.

Each of the lower active pattern 110AL, the upper active pattern 110BL, and the preliminary sacrificial pattern 410L may be on the substrate 100 and extend in the first direction (e.g., the Y direction). For example, a sacrificial film and an active film that are alternately stacked on the substrate 100 may be formed. A patterning process of patterning the sacrificial film and the active film may be performed.

Each of the lower active pattern 110AL and the upper active pattern 110BL may include silicon (Si) or germanium (Ge) as an elemental semiconductor material. Alternatively, each of the lower active pattern 110AL and the upper active pattern 110BL may include a compound semiconductor, for example, a group IV-IV compound semiconductor or a group III-V compound semiconductor.

The preliminary sacrificial pattern 410L may include a material having an etching selectivity with respect to the lower active pattern 110AL and the upper active pattern 110BL. In some embodiments, each of the lower active pattern 110AL and the upper active pattern 110BL may include silicon (Si), and the preliminary sacrificial pattern 410L may include silicon germanium (SiGe).

Figure 14:
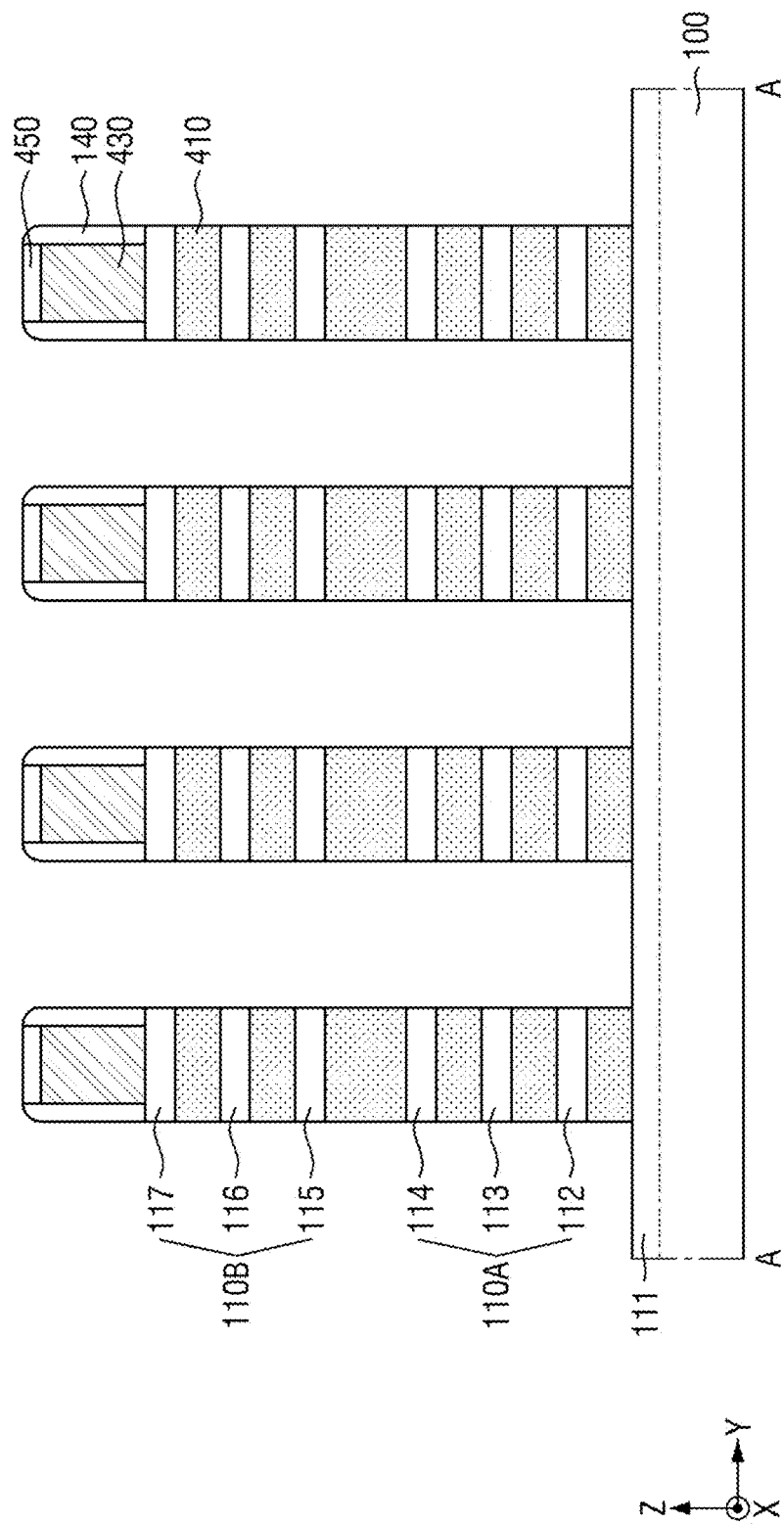

Referring to FIG. 13 and FIG. 14, a dummy gate electrode 430, a dummy gate capping pattern 450, and the gate spacer 140 may be formed on the substrate 100.

For example, the dummy gate electrode 430 and the dummy gate capping pattern 450 may be sequentially stacked on the lower active pattern 110AL, the upper active pattern 110BL, and the preliminary sacrificial pattern 410L. A plurality of dummy gate electrodes 430 may be spaced apart from each other. Each of the plurality of dummy gate electrodes 430 may extend in the second direction X. The gate spacer 140 may extend along a side surface of the dummy gate electrode 430 and a side surface of the dummy gate capping pattern 450.

Subsequently, the lower active pattern 110AL, the upper active pattern 110BL, and the preliminary sacrificial pattern 410L may be patterned using the dummy gate electrode 430 and the gate spacer 140 as an etching mask. Thus, each of the first lower wire pattern 110A, the first upper wire pattern 110B, and a sacrificial pattern 410 extending in the first direction Y may be formed. The sacrificial pattern 410 may be alternately and vertically arranged with the first lower wire pattern 110A and the first upper wire pattern 110B and on the substrate 100. Although not specifically shown, the second lower wire pattern 210A and the second upper wire pattern 210B may also be formed using the above-described step.

Figure 15:
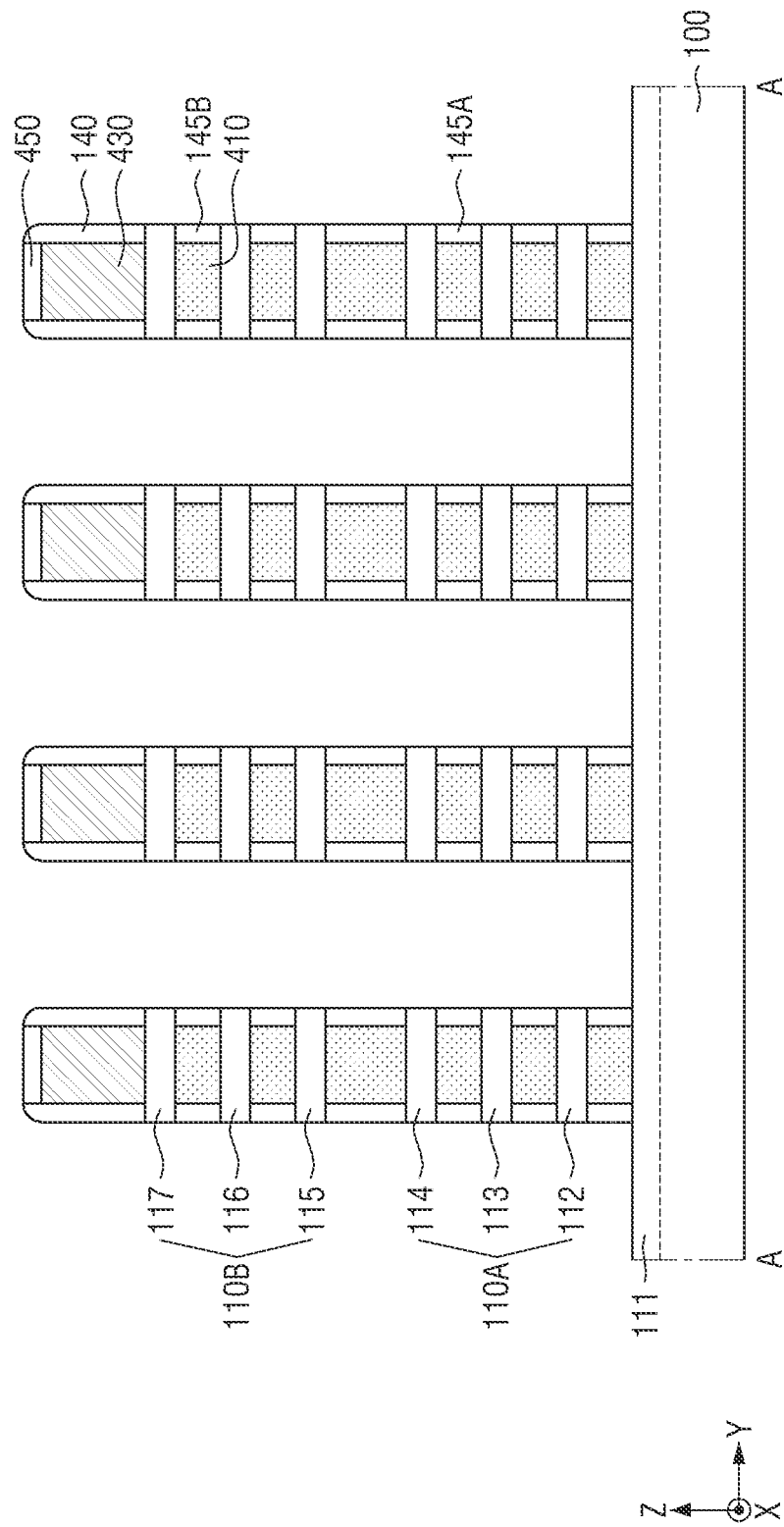

Referring to FIG. 15, the first inner spacer 145A and the second inner spacer 145B may be formed.

For example, a recess process may be performed into a side surface of the sacrificial pattern 410. Each of the first inner spacer 145A and the second inner spacer 145B may be formed within and/or to fill a recessed area of the sacrificial pattern 410. Thus, the first inner spacer 145A may be formed on a side surface of a portion of the sacrificial pattern 410 between adjacent ones of the first to third nanosheets 112, 113, and 114. The second inner spacer 145B may be formed on a side surface of a portion of the sacrificial pattern 410 between adjacent ones of the fourth to sixth nanosheets 115, 116, and 117.

Figure 16:
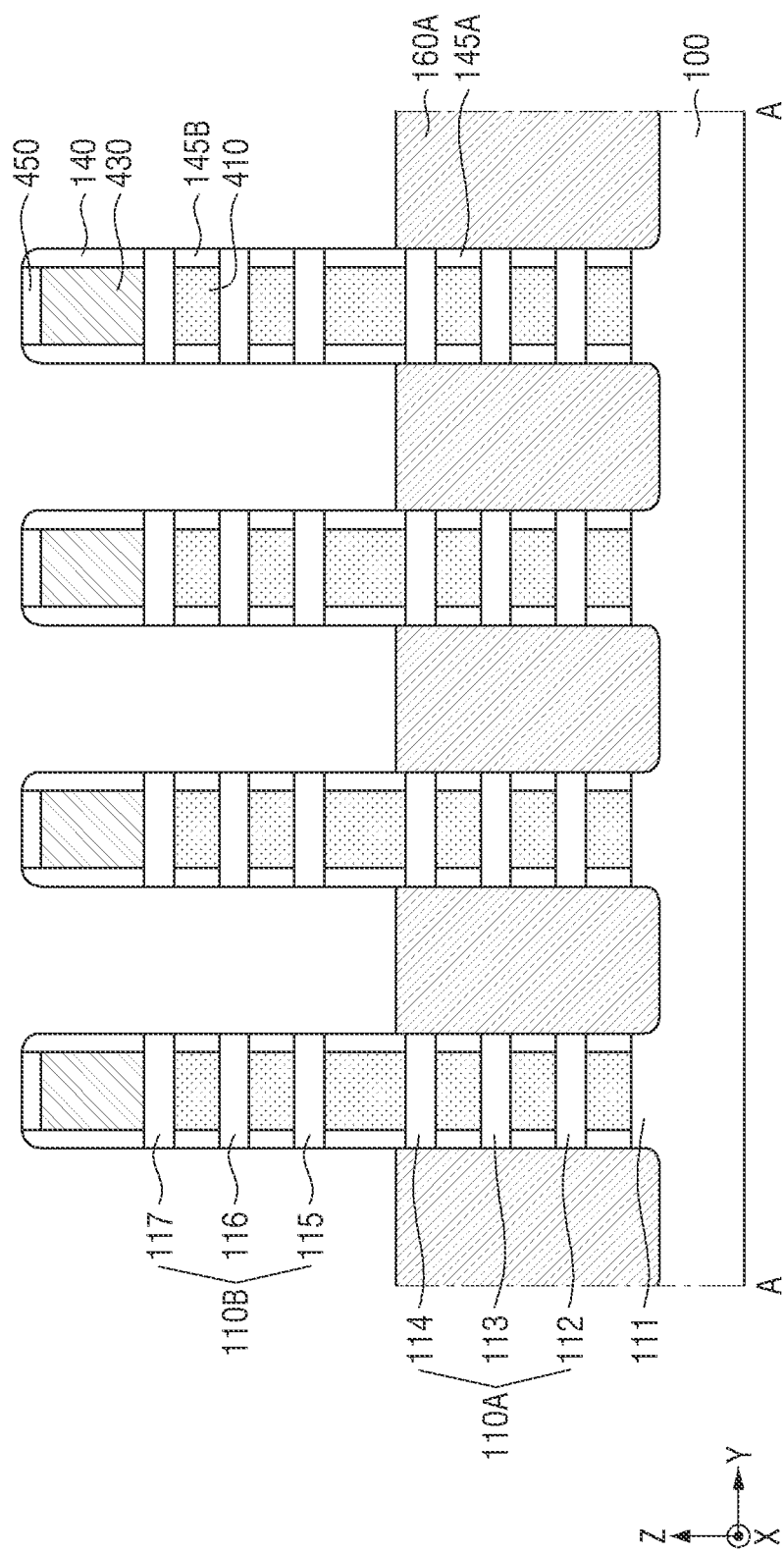

Referring to FIG. 16, the lower source/drain area 160A may be formed.

The lower source/drain area 160A may be formed on the substrate 100. Further, the lower source/drain area 160A may be formed on a side surface of each of the dummy gate electrodes 430. The lower source/drain area 160A may be connected to the first lower wire pattern 110A. The first lower source/drain area 160A may be formed via an epitaxial growth method using the substrate 100 and the first lower wire pattern 110A as a seed, with the understanding that the present disclosure is not limited thereto.

The lower source/drain area 160A may have a first conductivity type. In one example, the first conductivity type may be a n-type.

Figure 17:
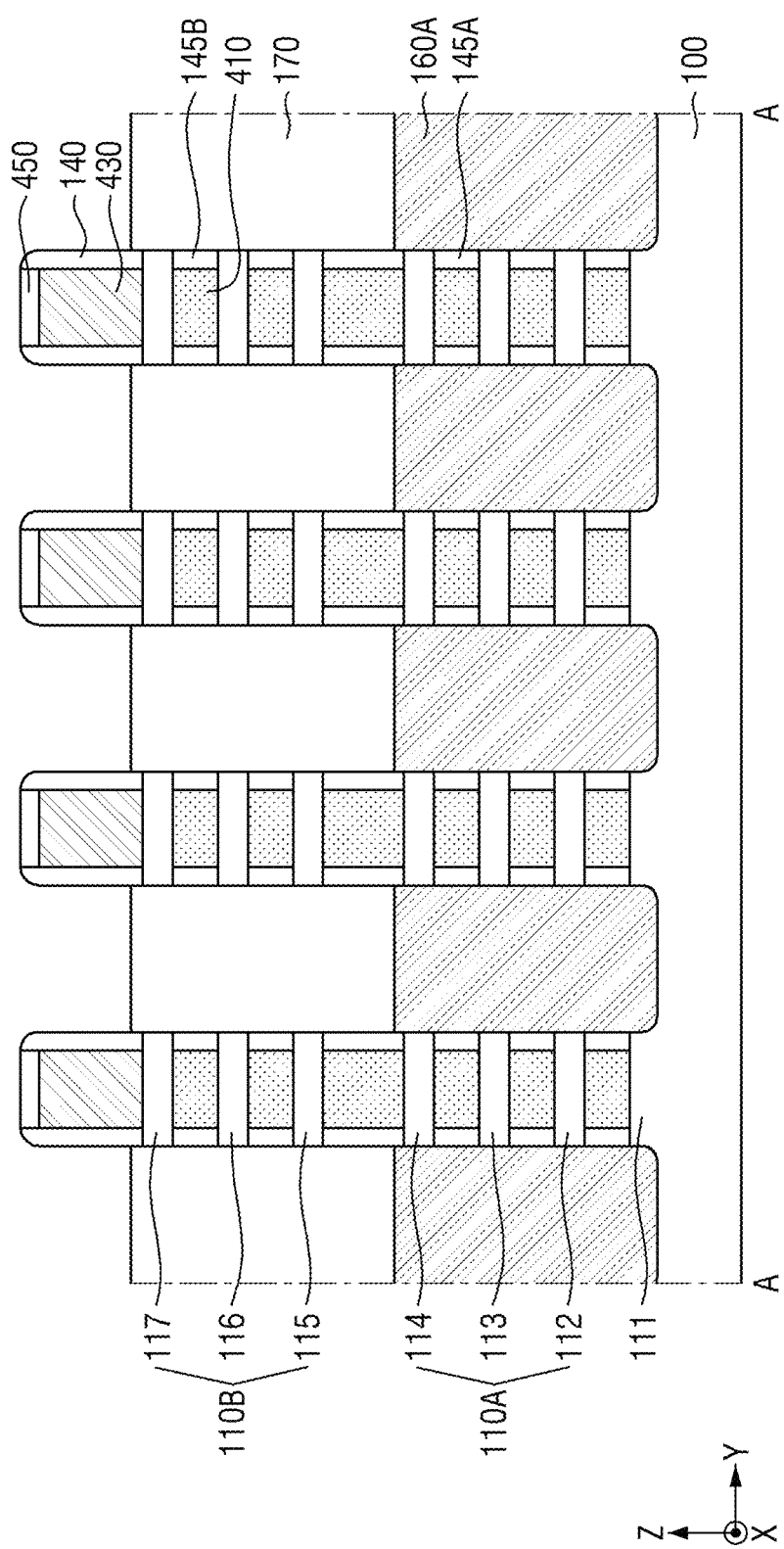

Referring to FIG. 17, the separating insulating film 170 may be formed.

The separating insulating film 170 may be formed on the substrate 100. Further, the separating insulating film 170 may cover the lower source/drain area 160A. The separating insulating film 170 may include, for example, at least one of silicon oxide, silicon oxynitride, and a low dielectric constant material.

Figure 18:
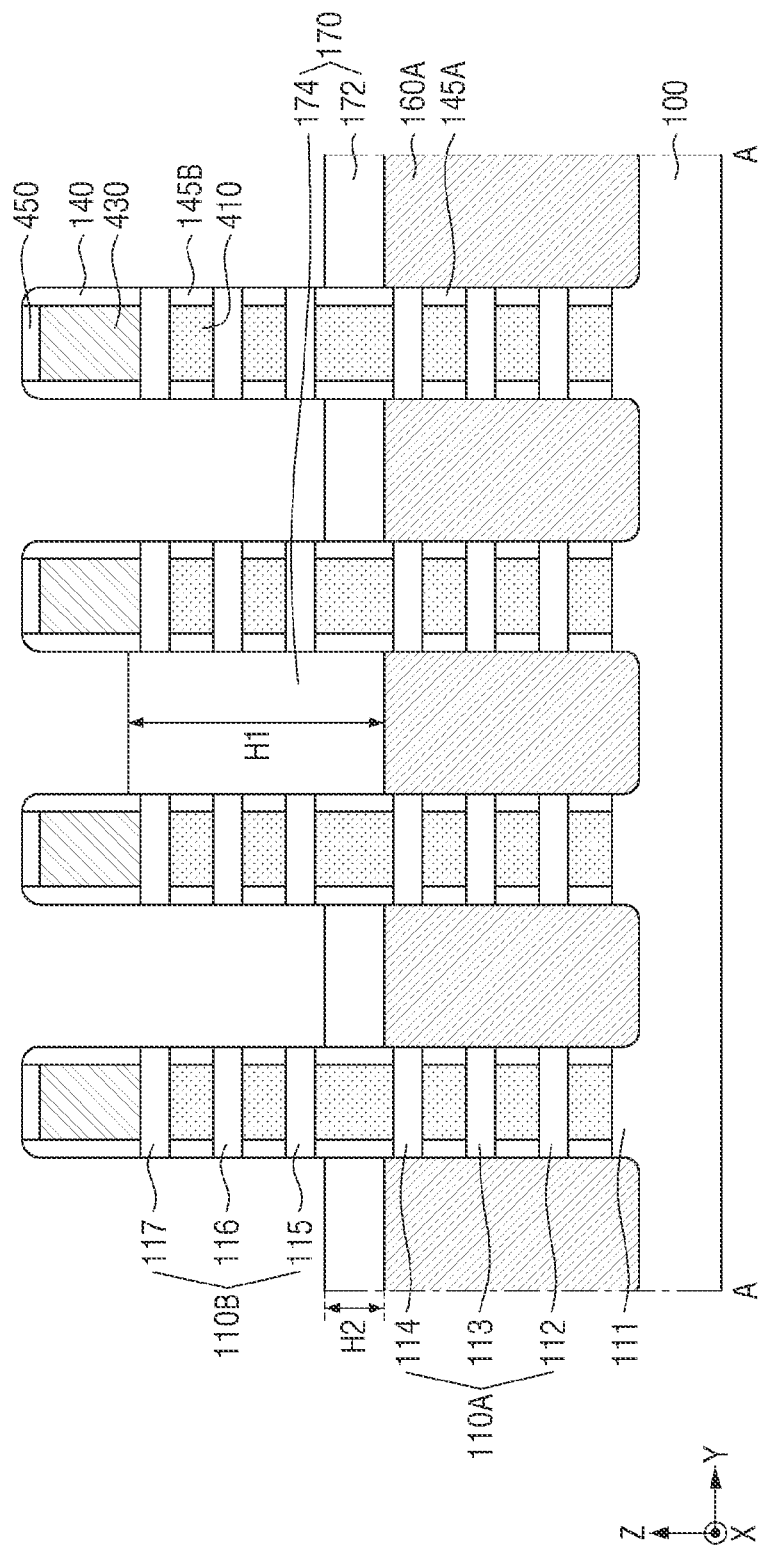

Referring to FIG. 18, a recess process may be performed into a portion of the separating insulating film 170.

Thus, the separating insulating film 170 that includes the first separating portion 172 and the second separating portion 174 that has a larger vertical dimension than that of the first separating portion 172 may be formed. For example, the vertical dimension H1 of the second separating portion 174 based on the topmost face of the lower source/drain area 160A may be greater than the vertical dimension H2 of the first separating portion 172 based on the topmost face of the lower source/drain area 160A. The second separating portion 174 may be formed in an area between the first gate line PG11 and the fifth gate line PG21 which will be described later.

Figure 19:
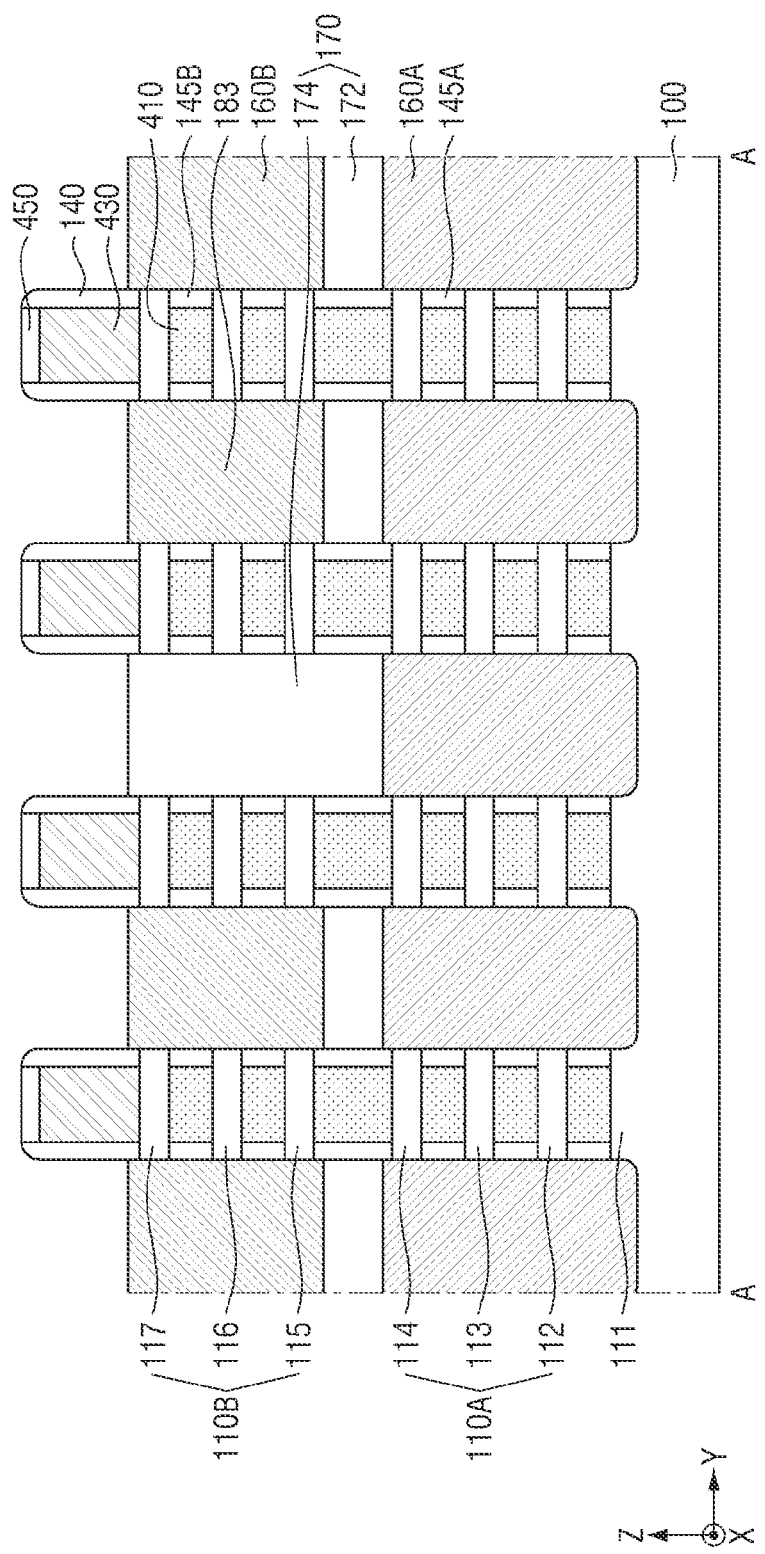

Referring to FIG. 19, the upper source/drain area 160B may be formed.

The upper source/drain area 160B may be formed on the separating insulating film 170. Further, the upper source/drain area 160B may be formed on a side surface of each of the dummy gate electrodes 430. The upper source/drain area 160B may be connected to the first upper wire pattern 110B. The upper source/drain area 160B may be formed via an epitaxial growth method using the first upper wire pattern 110B as a seed, with the understanding that the present disclosure is not limited thereto. Due to the second separating portion 174, the upper source/drain area 160B may not be formed in an area between the first gate line PG11 and the fifth gate line PG21, which will be described later.

The upper source/drain area 160B may have a second conductivity type different from the first conductivity type. In one example, the second conductivity type may be a p-type.

Figure 20:
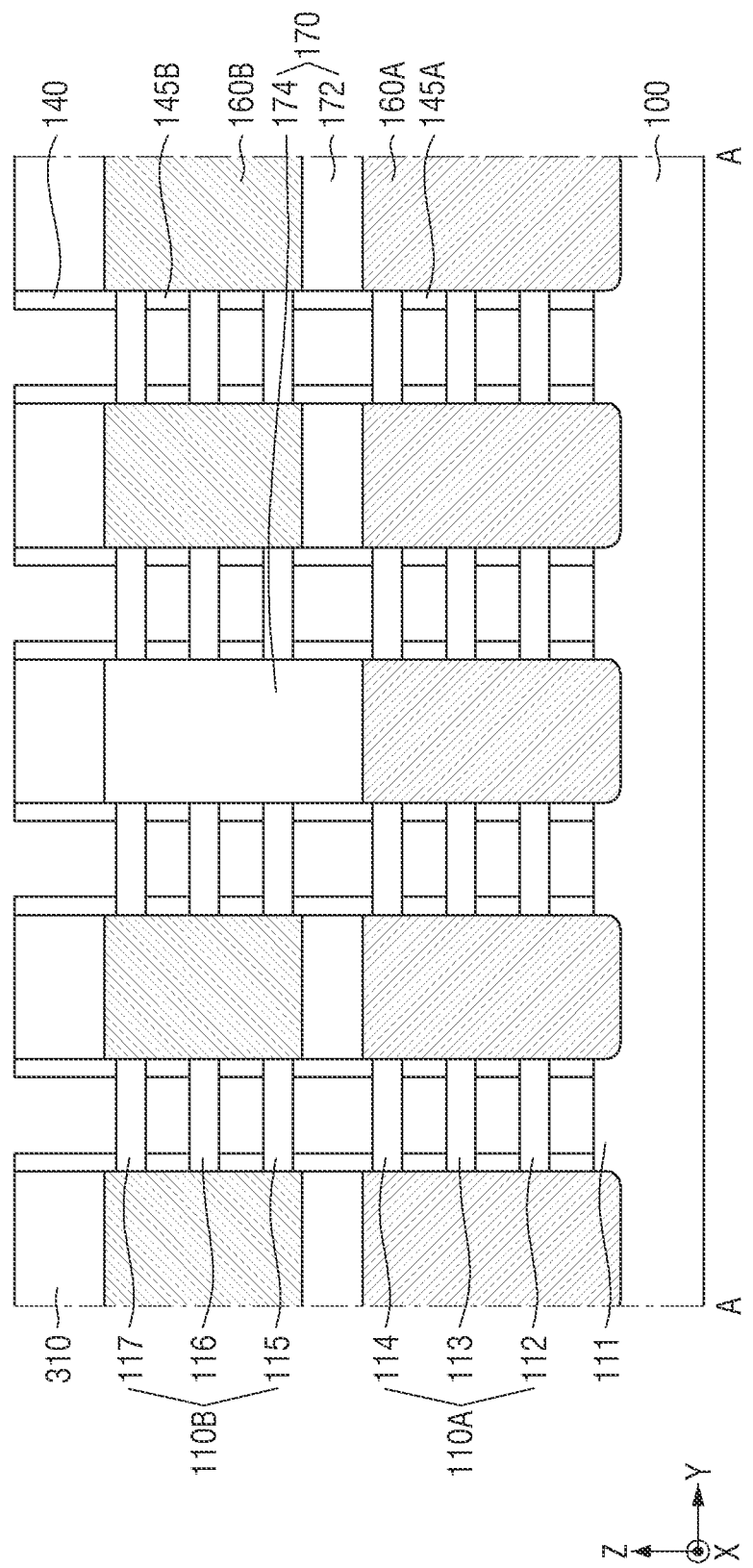

Referring to FIG. 20, the dummy gate electrode 430, the dummy gate capping pattern 450, and the sacrificial pattern 410 may be removed.

For example, an etching process for removing the dummy gate electrode 430, the dummy gate capping pattern 450, and the sacrificial pattern 410 may be performed. The etching process may include a wet etching process, as a non-limiting example. Because the sacrificial pattern 410 may have an etch selectivity with respect to the first lower wire pattern 110A and the first upper wire pattern 110B, the sacrificial pattern 410 may be selectively removed.

Figure 21:
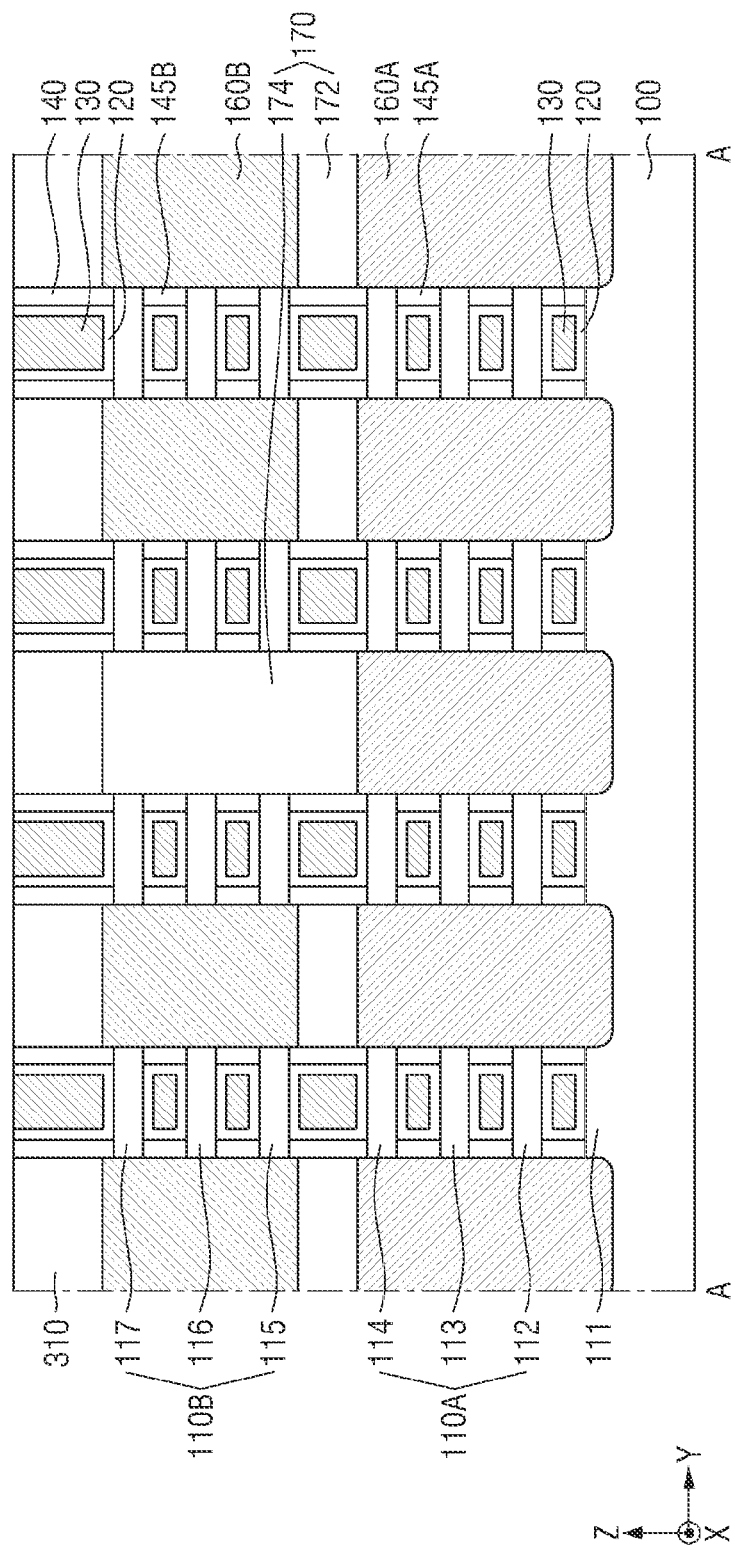

Referring to FIG. 20 and FIG. 21, the gate dielectric film 120 and the gate electrode 130 may be sequentially formed.

The gate dielectric film 120 may conform to and extend along a profile of an area from which the sacrificial pattern 410 is removed. The gate electrode 130 may be formed on the gate dielectric film 120. The gate electrode 130 may be formed to fill at least partially the area from which the sacrificial pattern 410 is removed.

Subsequently, the first interlayer insulating film 310 may be formed that covers the upper source/drain area 160B. In some embodiments, after the first interlayer insulating film 310 has been formed, a planarization process may be performed. The planarization process may include, for example, a chemical mechanical polishing (CMP) process, but the present disclosure is not limited thereto.

Figure 22:
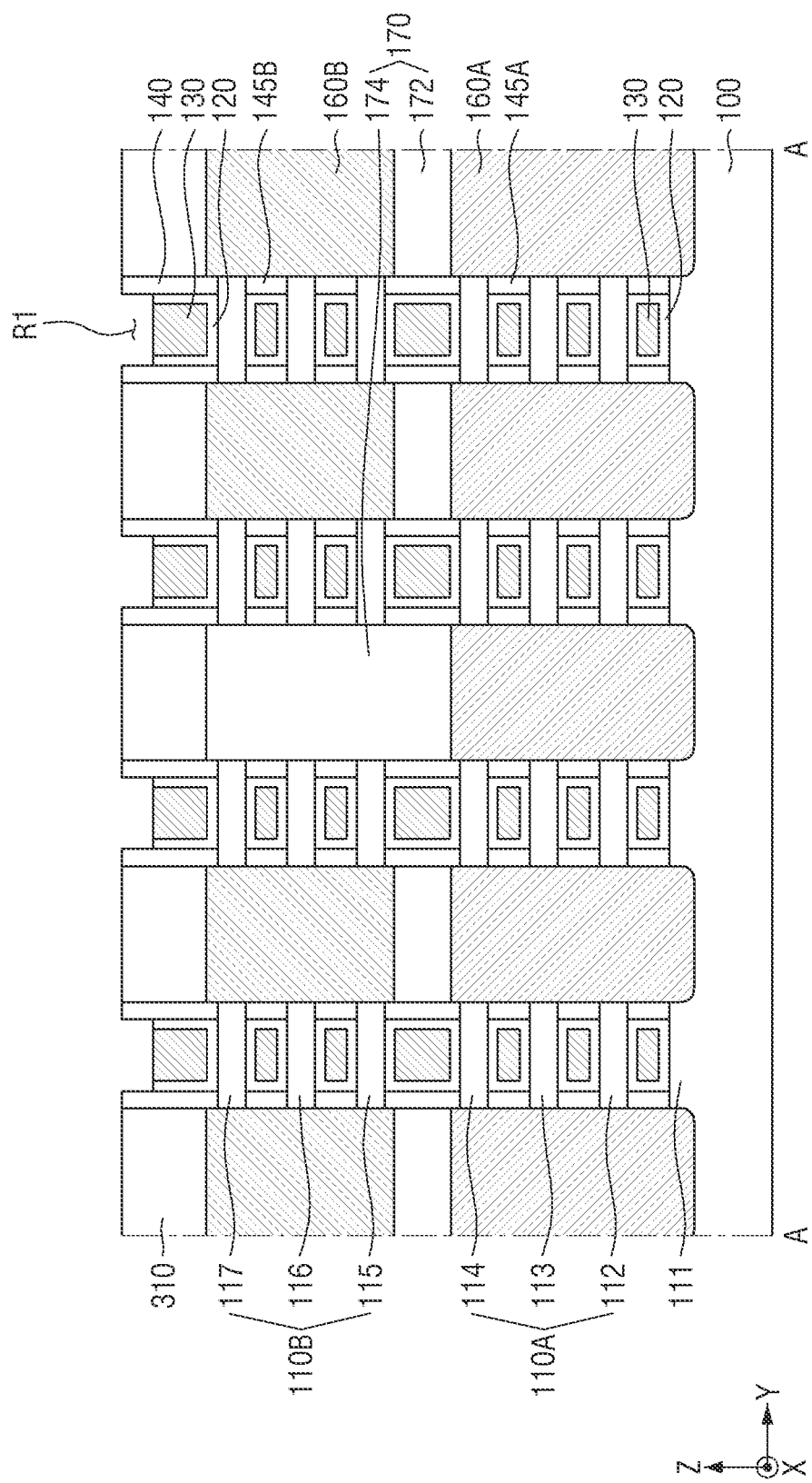

Referring to FIG. 22, a first recess R1 may be formed into the gate electrode 130.

For example, a recess process may be performed into a top surface of the gate electrode 130. In some embodiments, the recess process may selectively etch the gate dielectric film 120 and the gate electrode 130. Thus, a vertical level of each of a top surface of the gate dielectric film 120 and a top surface of the gate electrode 130 may be lower than that of a top surface of the gate spacer 140.

Figure 23:
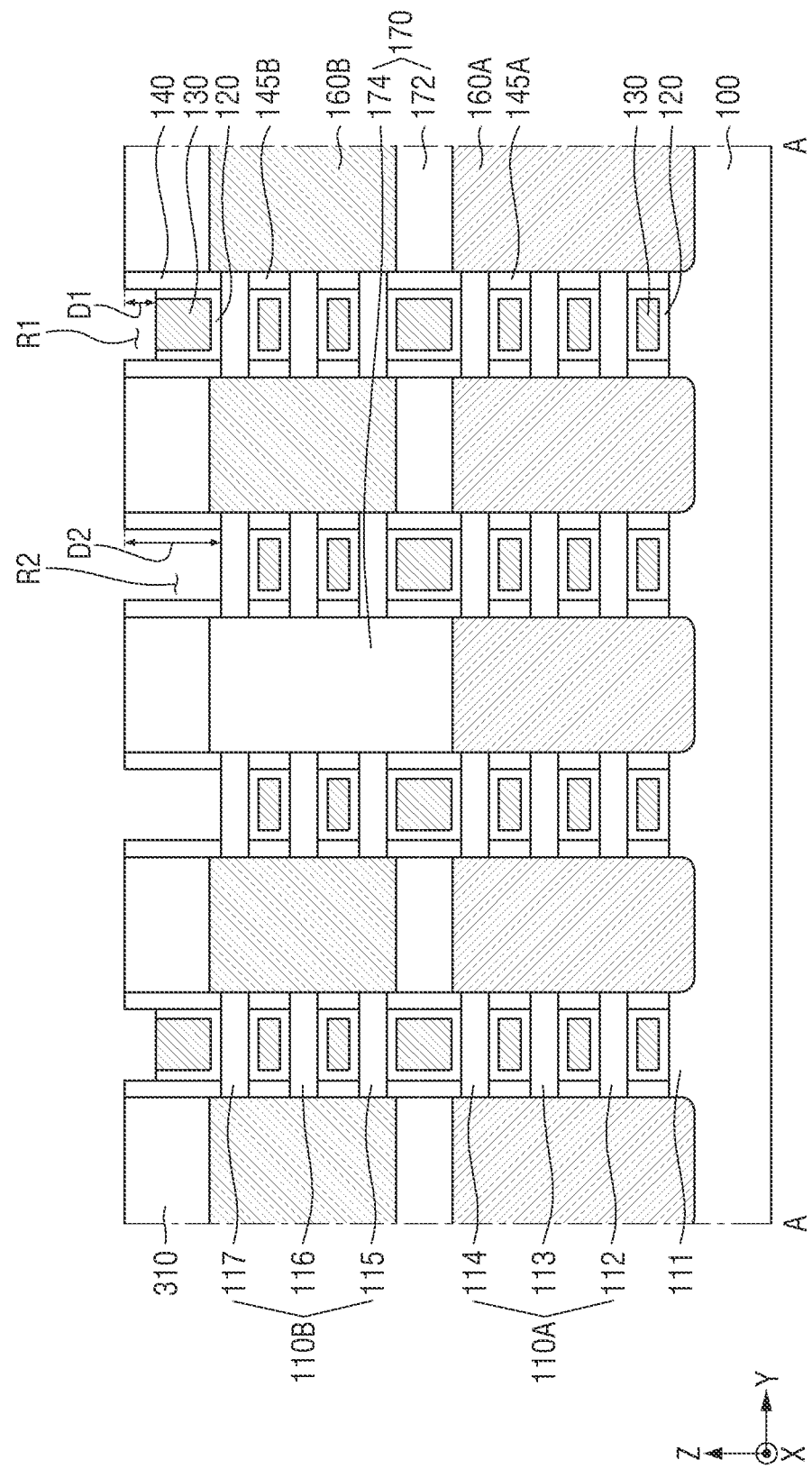

Referring to FIG. 23, a second recess R2 may be formed into a portion of the gate electrode 130.

For example, a recess process may be performed into a top surface of the portion of the gate electrode 130. Thus, the second recess R2 may be formed such that the second recess R2 is deeper than the first recess R1. For example, a depth D2 of a bottom surface of the second recess R2 from a top surface of the first interlayer insulating film 310 may be greater than a depth D1 of a bottom surface of the first recess R1 from the top surface of the first interlayer insulating film 310. The second recess R2 may be formed in a partial area of the first gate line PG11 and a partial area of the fifth gate line PG21, which will be described later.

Figure 24:
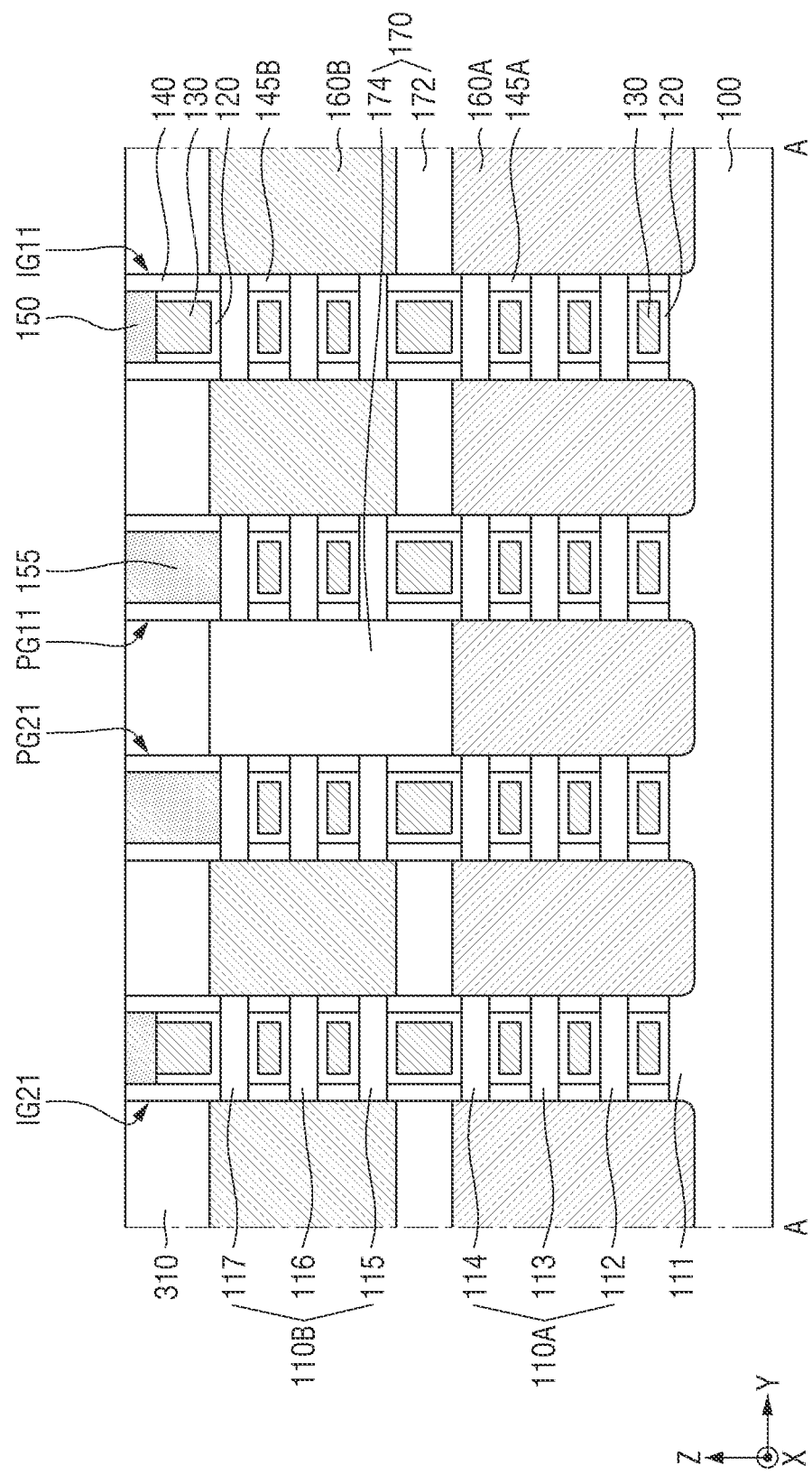

Referring to FIG. 23 and FIG. 24, the gate capping pattern 150 and the recess capping pattern 155 may be formed.

The gate capping pattern 150 may be formed to fill the first recess R1, and the recess capping pattern 155 may be formed to fill the second recess R2. Thus, the first gate line PG11, the second gate line IG11, the fifth gate line PG21, and the sixth gate line IG21 that are spaced apart from each other and extend in the second direction X may be formed. Although not specifically shown, it may be understood the third gate line IG12, the fourth gate line PG12, the seventh gate line IG22, and the eighth gate line PG22 may also be formed using one or more of the above-described operations.

Each of the gate capping pattern 150 and the recess capping pattern 155 may include, for example, at least one of silicon nitride, silicon oxynitride, silicon oxycarbide, silicon boron nitride, silicon boron carbonitride, silicon oxycarbonitride, and combinations thereof, with the understanding that the present disclosure is not limited thereto.

It has been described that the gate capping pattern 150 and the recess capping pattern 155 are formed at the same time. However, this is only an example. In some embodiments, the recess capping pattern 155 may be formed after the gate capping pattern 150 has been formed. For example, after the first recess R1 has formed and the gate capping pattern 150 that at least partially fills the first recess R1 has been formed, the second recess R2 may be formed and then the recess capping pattern 155 that at least partially fills the second recess R2 may be formed.

Then, referring to FIG. 2 to FIG. 5, the first common contact 183, the second common contact 187, the first source/drain contact 181, the second source/drain contact 184*a*, the third source/drain contact 185*a*, the fourth source/drain contact 186, the fifth source/drain contact 184*b*, the sixth source/drain contact 185*b*, the first overlapping contact 190A and the second overlapping contact 190B may be formed. Thus, the semiconductor memory device as described above with reference to FIG. 2 to FIG. 5 may be manufactured.

As described above, the first overlapping contact 190A may be formed to overlap the first gate line PG11. In this connection, the first overlapping contact 190A may be formed to overlap the recess capping pattern 155 that has the larger depth than that of the gate capping pattern 150. In this way, methods for manufacturing semiconductor memory devices having improved integration density and reduced process difficulty using simplified processes may be realized.

Further, in methods for manufacturing the semiconductor memory devices according to some embodiments, the first unit element I and the second unit element II may be separated from each other via a simplified process. Specifically, as described above, the first unit element I and the second unit element II may be separated from each other via the second separating portion 174 that is formed using the recess process into the portion of the separating insulating film 170. Thus, the semiconductor memory device in which the process difficulty is further reduced may be realized.

Figure 25:
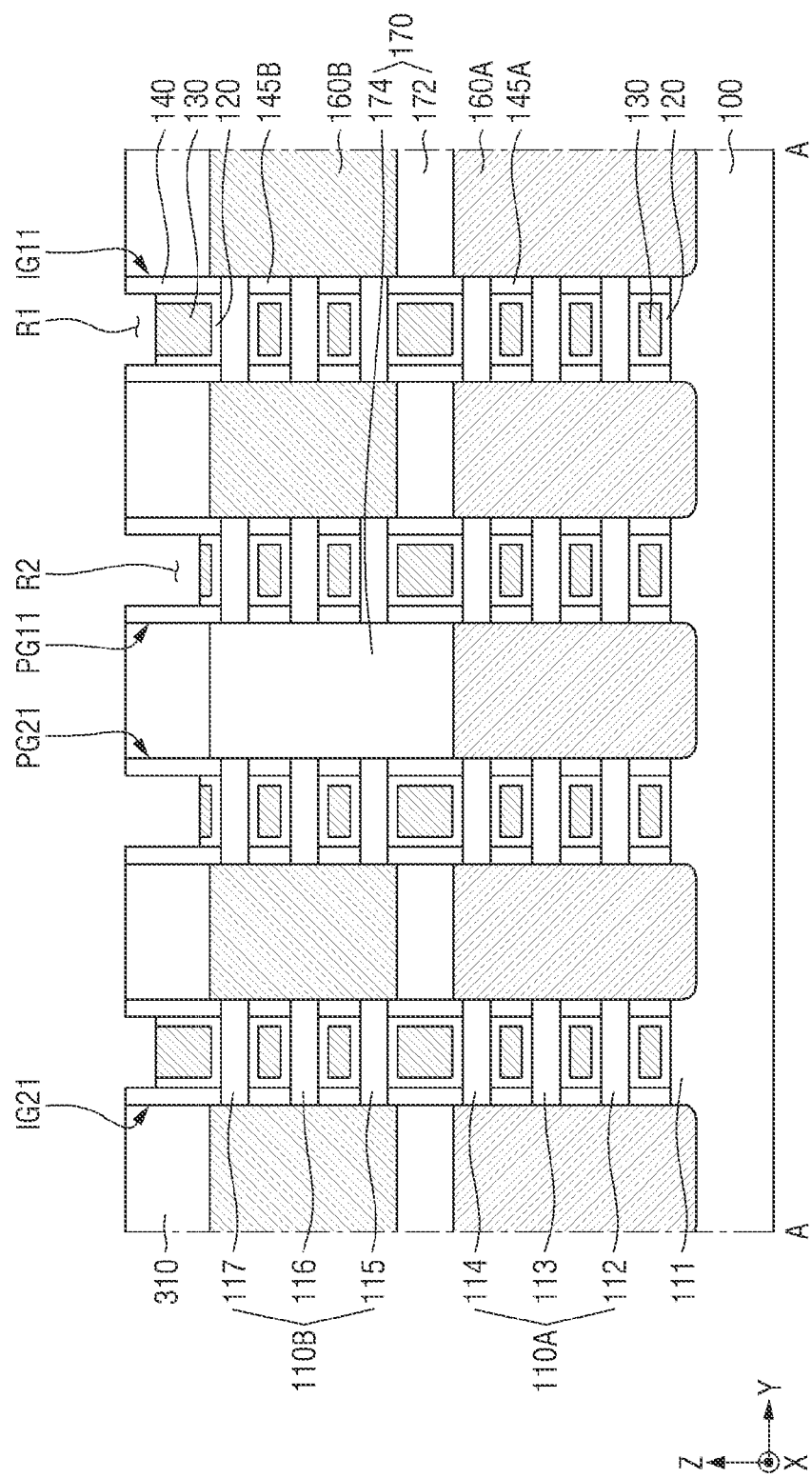

FIG. 25 is a diagram showing an intermediate step for illustrating a method for manufacturing a semiconductor memory device according to some embodiments. For convenience of description, some of the components and configurations previously described with reference to FIGS. 1 to 14 are only briefly described or discussion thereof is omitted altogether. For reference, FIG. 25 is a diagram of an intermediate step for illustrating the steps after FIG. 22.

Referring to FIG. 25, the second recess R2 may be formed so as not to expose a top surface of the first upper wire pattern 110B. Subsequently, the steps as described above with reference to FIG. 24 and FIG. 2 to FIG. 5 may be performed. Thus, the semiconductor memory device as described above with reference to FIG. 6 may be manufactured.

Figure 26:
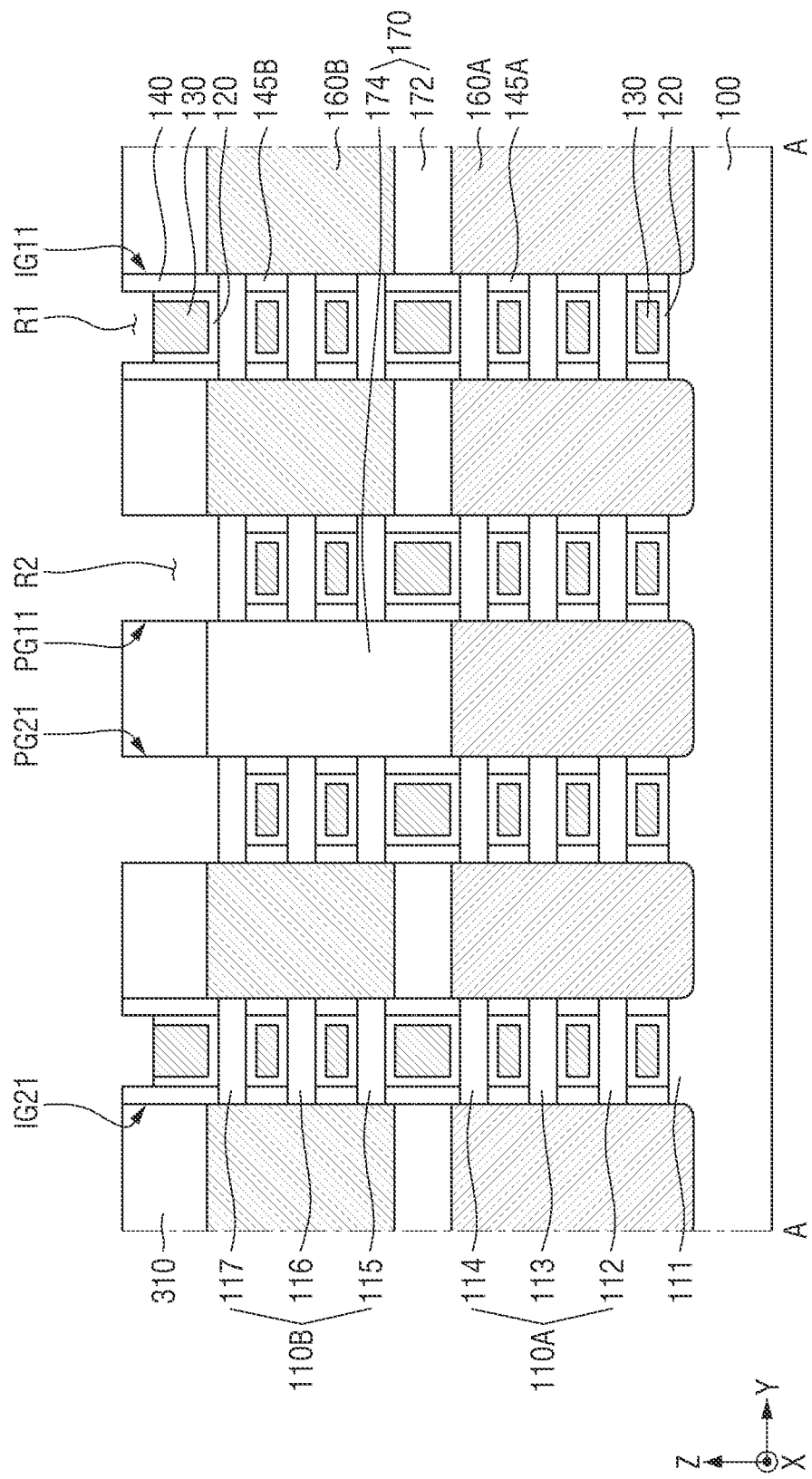
FIG. 26 is a diagram showing an intermediate step for illustrating operations of a method for manufacturing a semiconductor memory device according to some embodiments.

FIG. 26 is a diagram of an intermediate step for illustrating a method for manufacturing a semiconductor memory device according to some embodiments. For convenience of description, some of the components and configurations previously described with reference to FIGS. 1 to 24 are only briefly described or discussion thereof is omitted altogether. For reference, FIG. 26 is a diagram of an intermediate step for illustrating the steps after FIG. 22.

Referring to FIG. 26, the second recess R2 may be formed to remove the gate spacer 140. Subsequently, the steps as described above with reference to FIG. 24 and FIG. 2 to FIG. 5 may be performed. Thus, the semiconductor memory device as described above with reference to FIG. 7 may be manufactured.

Figure 27:
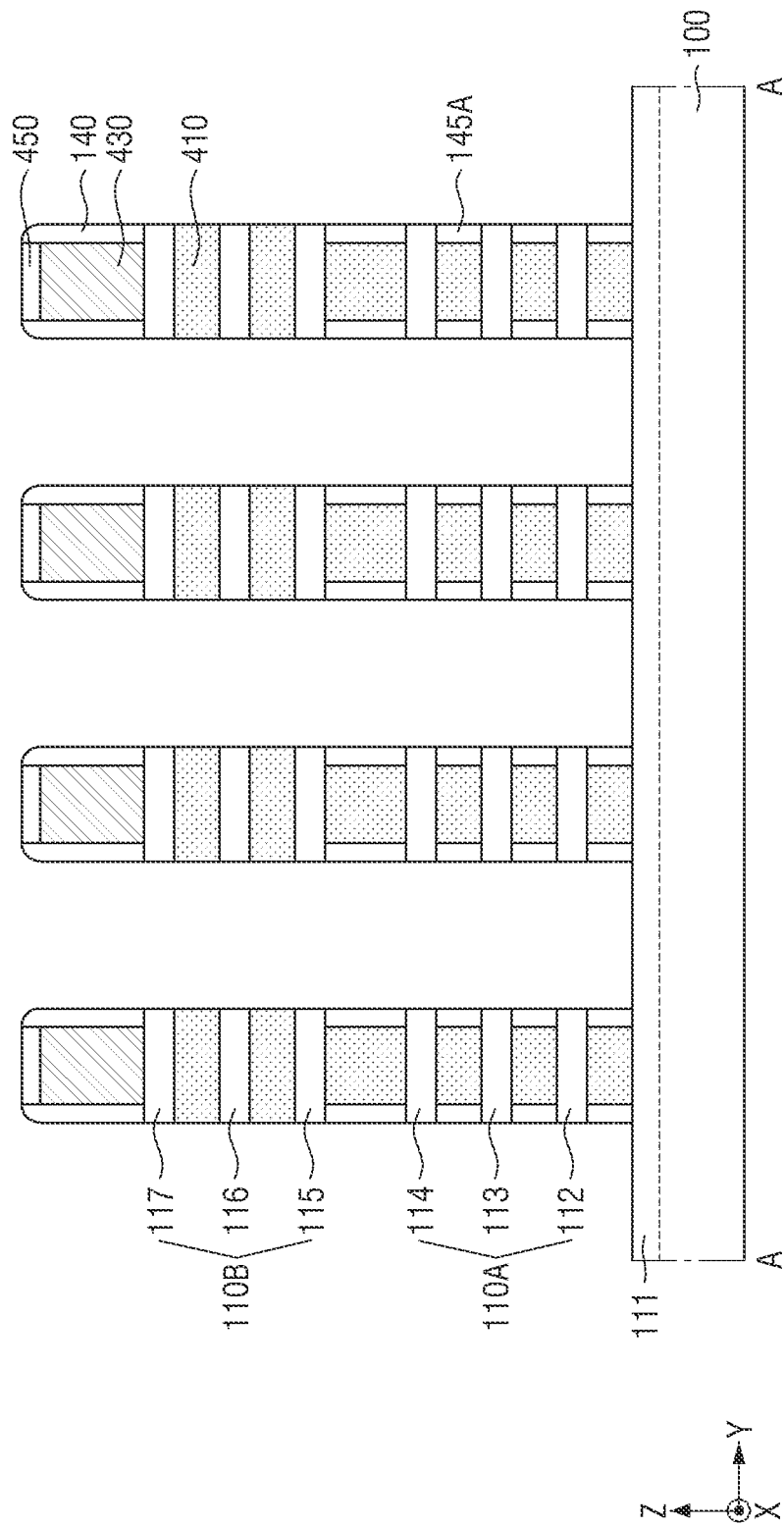
FIG. 27 is a diagram showing an intermediate step for illustrating operations of a method for manufacturing a semiconductor memory device according to some embodiments.

FIG. 27 is a diagram of an intermediate step for illustrating a method for manufacturing a semiconductor memory device according to some embodiments. For convenience of description, some of the components and configurations previously described with reference to FIGS. 1 to 24 are only briefly described or discussion thereof is omitted altogether. For reference, FIG. 27 is a diagram of an intermediate step for illustrating the steps after FIG. 14.

Referring to FIG. 27, the first inner spacer 145A may be formed.

For example, a recess process may be selectively performed on a side surface of a portion of the sacrificial pattern 410 between adjacent ones of the first to third nanosheets 112, 113, and 114. In one example, a portion of the sacrificial pattern 410 between adjacent ones of the first to third nanosheets 112, 113, and 114 may have an etching selectivity with respect to a portion of the sacrificial pattern 410 between adjacent ones of the fourth to sixth nanosheets 115, 116, and 117. The first inner spacer 145A may be formed to fill a recessed area of the sacrificial pattern 410. In this case, the second inner spacer 145B as described above using FIG. 15 may not be formed.

Subsequently, the steps as described above with reference to FIG. 16 to FIG. 24 and FIG. 2 to FIG. 5 may be performed. Thus, the semiconductor memory device as described above with reference to FIG. 8 may be manufactured.

While the present inventive concepts have been particularly shown and described with reference to some examples of embodiments thereof, it will be understood by those of ordinary skill in the art that various changes in form and details may be made therein without departing from the scope of the present inventive concepts as defined by the following claims. It is therefore desired that the present examples of embodiments be considered in all respects as illustrative and not restrictive, reference being made to the appended claims rather than the foregoing description to indicate the scope of the present application.

What is claimed is:

1. A semiconductor memory device comprising:
   a substrate;

a first lower wire pattern and a first upper wire pattern sequentially stacked on the substrate, and spaced apart from each other, each extending in a first direction;

a second lower wire pattern and a second upper wire pattern sequentially stacked on the substrate, and spaced apart from each other, each extending in the first direction, the second lower wire pattern and the second upper wire pattern spaced apart from the first lower wire pattern and the first upper wire pattern in a second direction that intersects the first direction;

a first gate line extending in the second direction, and surrounding the first lower wire pattern and the first upper wire pattern;

a second gate line extending in the second direction, and surrounding the second lower wire pattern and the second upper wire pattern, the second gate line spaced apart from the first gate line in the second direction;

a first lower source/drain area having a first conductivity type, on one side surface of the first gate line, and connected to the first lower wire pattern;

a first upper source/drain area having a second conductivity type different from the first conductivity type, on one side surface of the first gate line, and connected to the first upper wire pattern; and a first overlapping contact that electrically connects the first lower source/drain area, the first upper source/drain area and the second gate line to each other, wherein the first overlapping contact at least partially vertically overlaps the first gate line, wherein the first gate line includes a first gate electrode and a recess capping pattern, wherein the recess capping pattern covers a top surface of the first gate electrode that overlaps the first overlapping contact, wherein the second gate line includes a second gate electrode and a gate capping pattern, wherein the gate capping pattern covers a top surface of the second gate electrode, wherein a vertical level of a bottom surface of the recess capping pattern is lower than a vertical level of a bottom surface of the gate capping pattern, wherein a vertical level of a bottom surface of the first overlapping contact is lower than or equal to the vertical level of the bottom surface of the gate capping pattern, and wherein the vertical level of the bottom surface of the first overlapping contact is higher than the vertical level of the bottom surface of the recess capping pattern.

2. The semiconductor memory device of claim 1, wherein a top surface of the recess capping pattern and a top surface of the gate capping pattern are coplanar with each other.

3. The semiconductor memory device of claim 1, wherein the vertical level of the bottom surface of the recess capping pattern is higher than or equal to a vertical level of a top surface of the first upper wire pattern.

4. The semiconductor memory device of claim 1, wherein the first overlapping contact includes:

a first extension portion that extends in the first direction and overlaps the first lower wire pattern and the first upper wire pattern; and a second extension portion that extends from the first extension portion in the second direction and overlaps the first gate line and the second gate line.

5. The semiconductor memory device of claim 1, wherein the first conductivity type is a n-type, and the second conductivity type is a p-type.

6. The semiconductor memory device of claim 1, further comprising a separating insulating film that includes:

a first separating portion on one side of the first gate line that separates the first lower source/drain area and the first upper source/drain area from each other; and a second separating portion on an opposite side of the first gate line, wherein a vertical level of a top surface of the second separating portion is higher than a vertical level of a top surface of the first separating portion.

7. The semiconductor memory device of claim 6, wherein the vertical level of the top surface of the second separating portion is higher than or equal to a vertical level of a top surface of the first upper wire pattern.

8. The semiconductor memory device of claim 1, further comprising:

a third gate line extending in the second direction, and surrounding the first lower wire pattern and the first upper wire pattern, and spaced apart from the first gate line in the first direction;

a fourth gate line extending in the second direction, and surrounding the second lower wire pattern and the second upper wire pattern, and spaced apart from the third gate line in the second direction;

a second lower source/drain area having the first conductivity type, between the second gate line and the fourth gate line, and connected to the second lower wire pattern;

a second upper source/drain area having the second conductivity type, between the second gate line and the fourth gate line, and connected to the second upper wire pattern; and a second overlapping contact that electrically connects the second lower source/drain area, the second upper source/drain area, and the third gate line to each other.

9. A semiconductor memory device comprising:

a substrate;

a first lower wire pattern and a first upper wire pattern sequentially stacked on the substrate, and spaced apart from each other, each extending in a first direction;

a second lower wire pattern and a second upper wire pattern sequentially stacked on the substrate, and spaced apart from each other, each extending in the first direction, the second lower wire pattern and the second upper wire pattern spaced apart from the first lower wire pattern and the first upper wire pattern in a second direction that intersects the first direction;

a first gate line extending in the second direction, and surrounding the first lower wire pattern and the first upper wire pattern;

a second gate line extending in the second direction, and surrounding the second lower wire pattern and the second upper wire pattern, wherein the second gate line is spaced apart from the first gate line in the second direction;

a first lower source/drain area having a first conductivity type, on one side of the first gate line, and connected to the first lower wire pattern;

a first upper source/drain area having a second conductivity type different from the first conductivity type, on one side of the first gate line, and connected to the first upper wire pattern;

a common contact extending in a third direction that intersects a top surface of the substrate, wherein the common contact is connected to the first lower source/drain area and the first upper source/drain area; and an overlapping contact that electrically connects the common contact and the second gate line to each other, wherein the overlapping contact at least partially overlaps the first gate line, wherein the first gate line includes a first gate electrode and a recess capping pattern, wherein the recess capping pattern covers a top surface of the first gate electrode that overlaps the overlapping contact, wherein the second gate line includes a second gate electrode and a gate capping pattern, wherein the gate capping pattern covers a top surface of the second gate electrode, wherein a vertical level of a bottom surface of the overlapping contact is lower than or equal to a vertical level of the bottom surface of the gate capping pattern, and wherein the vertical level of the bottom surface of the overlapping contact is higher than a vertical level of the bottom surface of the recess capping pattern.

10. The semiconductor memory device of claim 9, wherein the overlapping contact includes:
a first extension portion that extends in the first direction and is connected to the common contact; and
a second extension portion that extends from the first extension portion in the second direction and overlaps the first gate line and the second gate line.

11. The semiconductor memory device of claim 9, further comprising a wiring pattern that extends in the first direction and connects the common contact and the overlapping contact to each other,
wherein the overlapping contact extends in the second direction and overlaps the first gate line and the second gate line.

12. The semiconductor memory device of claim 11, wherein the wiring pattern is on a top surface of the common contact and a top surface of the overlapping contact.

13. The semiconductor memory device of claim 9, further comprising:
a second lower source/drain area having the first conductivity type, on one side of the second gate line, and connected to the second lower wire pattern;
a second upper source/drain area having the second conductivity type, on one side of the second gate line, and connected to the second upper wire pattern;
a first lower source/drain contact connected to the second lower source/drain area and isolated from the second upper source/drain area; and
a first upper source/drain contact connected to the second upper source/drain area and isolated from the second lower source/drain area.

14. A semiconductor memory device comprising:
a substrate;
a first lower wire pattern and a first upper wire pattern sequentially stacked on the substrate, and spaced apart from each other, each extending in a first direction;
a second lower wire pattern and a second upper wire pattern sequentially stacked on the substrate, and spaced apart from each other, each extending in the first direction, the second lower wire pattern and the second upper wire pattern spaced apart from the first lower wire pattern and the first upper wire pattern in a second direction that intersects the first direction;
a first gate line extending in the second direction, and surrounding the first lower wire pattern and the first upper wire pattern;
a second gate line extending in the second direction, and surrounding the second lower wire pattern and the second upper wire pattern, wherein the second gate line is spaced apart from the first gate line in the second direction;
a third gate line extending in the second direction, and surrounding the first lower wire pattern and the first upper wire pattern, and spaced apart from the first gate line in the first direction;
a fourth gate line extending in the second direction, and surrounding the second lower wire pattern and the second upper wire pattern, and spaced apart from the third gate line in the second direction;
a first lower source/drain area having a first conductivity type, between the first gate line and the third gate line, and connected to the first lower wire pattern;
a first upper source/drain area having a second conductivity type different from the first conductivity type, between the first gate line and the third gate line, and connected to the first upper wire pattern; and
a first overlapping contact that electrically connects the first lower source/drain area, the first upper source/drain area, and the second gate line to each other, wherein the first overlapping contact at least partially overlaps the first gate line, wherein each of the first to fourth gate lines includes a gate electrode and a gate capping pattern that covers a top surface of the gate electrode, wherein the first gate line further includes a first recess capping pattern that covers a top surface of the gate electrode of the first gate line overlapping the first overlapping contact, and wherein a vertical level of a bottom surface of the first recess capping pattern is lower than a vertical level of a bottom surface of the gate capping pattern wherein a vertical level of a bottom surface of the first overlapping contact is lower than or equal to the vertical level of the bottom surface of the gate capping pattern, and wherein the vertical level of the bottom surface of the first overlapping contact is higher than the vertical level of the bottom surface of the first recess capping pattern, wherein a vertical level of a bottom surface of the first overlapping contact is lower than or equal to the vertical level of the bottom surface of the gate capping pattern, and wherein the vertical level of the bottom surface of the first overlapping contact is higher than the vertical level of the bottom surface of the first recess capping pattern.

15. The semiconductor memory device of claim 14, further comprising:
a second lower source/drain area having the first conductivity type, between the second gate line and the fourth gate line, and connected to the second lower wire pattern;
a second upper source/drain area having the second conductivity type, between the second gate line and the fourth gate line, and connected to the second upper wire pattern; and
a second overlapping contact that electrically connects the second lower source/drain area, the second upper source/drain area and the third gate line to each other,
wherein the first overlapping contact and the second overlapping contact are at the same vertical level.

16. The semiconductor memory device of claim 15, wherein the second overlapping contact at least partially overlaps the fourth gate line,
wherein the fourth gate line further includes a second recess capping pattern that covers a top surface of the gate electrode of the fourth gate line that overlaps the second overlapping contact, wherein a vertical level of a bottom surface of the second recess capping pattern is lower than the vertical level of the bottom surface of the gate capping pattern.

17. The semiconductor memory device of claim 14, further comprising:

a fifth gate line extending in the second direction, and surrounding the first lower wire pattern and the first upper wire pattern, wherein the fifth gate line is spaced apart from the third gate line with the first gate line therebetween; and a separating insulating film including:

a first separating portion between the first gate line and the third gate line that separates the first lower source/drain area and the first upper source/drain area from each other; and a second separating portion between the first gate line and the fifth gate line, wherein a vertical level of a top surface of the second separating portion is higher than a vertical level of a top surface of the first separating portion.

18. The semiconductor memory device of claim 17, wherein the vertical level of the top surface of the second separating portion is higher than or equal to a vertical level of a top surface of the first upper wire pattern.

19. The semiconductor memory device of claim 14, wherein the first conductivity type is a n-type and the second conductivity type is a p-type.

\* \* \* \* \*